(12) United States Patent
Jung et al.

(10) Patent No.: US 12,230,732 B2
(45) Date of Patent: Feb. 18, 2025

(54) LIGHT EMITTING DEVICE SOLVENT, LIGHT EMITTING DEVICE INK COMPRISING SAME, AND METHOD FOR MANUFACTURING DISPLAY DEVICE

(71) Applicant: Samsung Display Co., Ltd., Yongin-si (KR)

(72) Inventors: Jae Hoon Jung, Seoul (KR); Hye Jung Hong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 770 days.

(21) Appl. No.: 17/310,546

(22) PCT Filed: Jan. 30, 2020

(86) PCT No.: PCT/KR2020/001395
§ 371 (c)(1),
(2) Date: Aug. 10, 2021

(87) PCT Pub. No.: WO2020/166853
PCT Pub. Date: Aug. 20, 2020

(65) Prior Publication Data
US 2022/0069158 A1    Mar. 3, 2022

(30) Foreign Application Priority Data

Feb. 11, 2019    (KR) .......................... 10-2019-0015722

(51) Int. Cl.
*H01L 33/00*    (2010.01)
*C09D 11/033*    (2014.01)
(Continued)

(52) U.S. Cl.
CPC ........ *H01L 33/0095* (2013.01); *C09D 11/033* (2013.01); *C09D 11/037* (2013.01);
(Continued)

(58) Field of Classification Search
None
See application file for complete search history.

(56) References Cited

U.S. PATENT DOCUMENTS

| 6,856,088 B2 | 2/2005 | Bae et al. |
| 8,012,527 B2 | 9/2011 | Ha et al. |

(Continued)

FOREIGN PATENT DOCUMENTS

| CN | 107706217 A | 2/2018 |
| CN | 108206228 B | 11/2022 |

(Continued)

OTHER PUBLICATIONS

Notice of Allowance issued on Feb. 7, 2024, in corresponding Korean Patent Application No. KR 10-2019-0015722 (2 pages).

(Continued)

*Primary Examiner* — Tae H Yoon
(74) *Attorney, Agent, or Firm* — Lewis Roca Rothgerber Christie LLP

(57) ABSTRACT

A light device solvent, a light emitting device ink comprising same, and a method for manufacturing a display device are provided. A method for manufacturing a display device comprises the acts of: spraying a device ink, which comprises a first element solvent and a light emitting element dispersed in the first element solvent, onto a target substrate having a first electrode and a second electrode thereon; forming a second element solvent, which has an isomeric structure of the molecular structure of the first element solvent, and loading the light emitting element on the first electrode and the second electrode; and removing the second element solvent.

20 Claims, 21 Drawing Sheets

(51) Int. Cl.
  *C09D 11/037* (2014.01)
  *C09D 11/50* (2014.01)
  *C09D 11/52* (2014.01)
  *H01L 33/20* (2010.01)
  *H01L 33/32* (2010.01)

(52) U.S. Cl.
  CPC .............. *C09D 11/50* (2013.01); *C09D 11/52* (2013.01); *H01L 33/20* (2013.01); *H01L 33/32* (2013.01)

(56) References Cited

U.S. PATENT DOCUMENTS

| | | | |
|---|---|---|---|
| 8,585,454 | B2 | 11/2013 | Cha et al. |
| 9,803,137 | B2 | 10/2017 | Kuzumoto et al. |
| 2003/0127977 | A1 | 7/2003 | Bae et al. |
| 2007/0120469 | A1 | 5/2007 | Ha et al. |
| 2007/0153371 | A1 | 7/2007 | Cha et al. |
| 2011/0177304 | A1 | 7/2011 | Rokuhara |
| 2017/0138549 | A1 | 5/2017 | Do et al. |
| 2018/0019377 | A1 | 1/2018 | Kim et al. |
| 2018/0175104 | A1 | 6/2018 | Kang et al. |
| 2019/0264053 | A1 | 8/2019 | Kim et al. |

FOREIGN PATENT DOCUMENTS

| | | |
|---|---|---|
| JP | S 51-90386 A | 8/1976 |
| JP | 2001-098197 A | 4/2001 |
| JP | 2003-268042 A | 9/2003 |
| JP | 2003-338370 A | 11/2003 |
| JP | 2006-241383 A | 9/2006 |
| JP | 3838964 B2 * | 10/2006 |
| JP | 2008-260073 A | 10/2008 |
| JP | 2010-067543 A | 3/2010 |
| JP | 2015-004957 A | 1/2015 |
| JP | 2016-074873 A | 5/2016 |
| JP | 2017-509779 A | 4/2017 |
| JP | 2020-512419 A | 4/2020 |
| KR | 10-2003-0058767 A | 7/2003 |
| KR | 10-0661642 B1 | 12/2006 |
| KR | 10-0786993 B1 | 12/2007 |
| KR | 10-2011-0056383 A | 5/2011 |
| KR | 2016-0057561 A | 5/2016 |
| KR | 2017-0083191 A | 7/2017 |
| KR | 10-2018-0130214 A | 12/2018 |

OTHER PUBLICATIONS

Eo, Yun Jae et al., "Enhanced DC-operated electroluminescence of forwardly aligned p/MQW/n InGaN nanorod LEDs via DC offset-AC dielectrophoresis", *ACS Appl. Mater. Interfaces*, 2017; DOI: 10.1021/acsami.7b09794, 34pp.

Irie, Masahiro et al., "Photoresponsive Polymers. 2.[1] Reversible Solution Viscosity Change of Polyamides having Azobenzene Residues in the Main Chain", Macromolecules, 1981, 14(2), pp. 262-267.

Chinese Office Action issued Jun. 25, 2024, in corresponding Chinese Patent Application No. CN 202080014619.1 (5 pages).

* cited by examiner

150: 151, 152

150: 151, 152

LIGHT EMITTING DEVICE SOLVENT, LIGHT EMITTING DEVICE INK COMPRISING SAME, AND METHOD FOR MANUFACTURING DISPLAY DEVICE

CROSS-REFERENCE TO RELATED APPLICATIONS

This application is a U.S. National Phase Patent Application of International Patent Application Number PCT/KR2020/001395, filed on Jan. 30, 2020, which claims priority to Korean Patent Application Number 10-2019-0015722, filed on Feb. 11, 2019, the entire content of all of which is incorporated herein by reference.

BACKGROUND

1. Field

The present disclosure relates to a light emitting element solvent, a light emitting element ink including the same, and a method for manufacturing a display device, and more particularly, to a light emitting element solvent in which light emitting elements are dispersed and whose viscosity can be adjusted, a light emitting element ink including the light emitting element solvent, and a method for manufacturing a display device.

2. Description of Related Art

The importance of display devices is increasing with the development of multimedia. Accordingly, various display devices such as organic light-emitting display (OLED) devices and liquid crystal display (LCD) devices are being used.

A display panel such as an OLED panel or an LCD panel is a device included in a display device to display an image. Among such display panels, a light-emitting element may be provided as a light-emitting display panel, and examples of a light-emitting diode (LED) include an organic LED (OLED) using an organic material as a fluorescent material and an inorganic LED using an inorganic material as a fluorescent material.

An inorganic LED using an inorganic semiconductor as a fluorescent material has durability even in a high-temperature environment and has higher efficiency in blue light compared to the organic LED. In a manufacturing process pointed out as a limit of an existing inorganic LED element, a transfer method using a dielectrophoresis (DEP) method has been developed. Accordingly, research is being continuously conducted on the inorganic light-emitting diode having higher durability and efficiency than those of the organic light-emitting diode.

SUMMARY

Aspects of embodiments of the present disclosure provide a light emitting element solvent which includes a functional group including at least one double bond and which undergoes an isomerization reaction in response to irradiated light or heat and a light emitting element ink including the light emitting element solvent.

Aspects of embodiments of the present disclosure also provide a method for manufacturing a display device using a light emitting element ink which includes the light emitting element solvent and light emitting elements dispersed in the light emitting element solvent.

It should be noted that aspects and embodiments of the disclosure are not limited thereto and other aspects and embodiments, which are not mentioned herein, will be apparent to those of ordinary skill in the art from the following description.

According to an embodiment of the disclosure, a method for manufacturing a display device comprises spraying a device ink, which comprises a first element solvent and light emitting elements dispersed in the first element solvent, on a target substrate having a first electrode and a second electrode formed thereon, forming a second element solvent having an isomeric structure of a molecular structure of the first element solvent and loading the light emitting elements on the first electrode and the second electrode, and removing the second element solvent.

The first element solvent may comprise a first functional group and a second functional group represented by Chemical Formula 1 below, and a third functional group comprising at least one double bond having an isomeric structure and bonded to the first functional group and the second functional group:

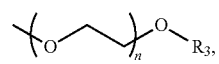

Chemical Formula 1 wherein n is an integer of 1 to 5, and $R_3$ is any one of a $C_1$-$C_5$ alkyl group, a $C_2$-$C_5$ alkenyl group, a $C_2$-$C_5$ alkynyl group, a $C_1$-$C_5$ alkyl ether group, a $C_2$-$C_5$ alkenyl ether group, and a $C_2$-$C_5$ alkyl ester group.

The first element solvent may form the second element solvent as the double bond of the third functional group undergoes a cis-trans isomerization reaction in response to irradiated light.

The first element solvent may comprise at least any one of compounds represented by Chemical Formulae 2 through 4 below:

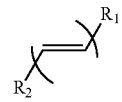

Chemical Formula 2

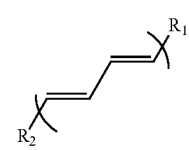

Chemical Formula 3

Chemical Formula 4

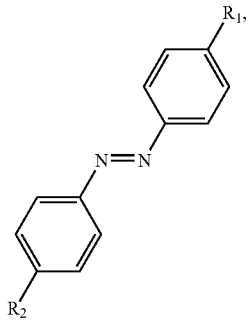

wherein $R_1$ and $R_2$ are represented by Chemical Formula 1, and the sum of an n value (n1) of $R_1$ and an n value (n2) of $R_2$ represented by Chemical Formula 1 is in the range of 2 to 6.

The first element solvent may comprise at least any one of compounds represented by Chemical Formulae 7 through 9 below:

Chemical Formula 5

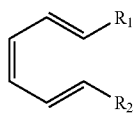

Chemical Formula 6

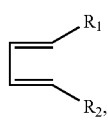

wherein $R_1$ and $R_2$ are represented by Chemical Formula 1, and the sum of an n value (n1) of $R_1$ and an n value (n2) of $R_2$ represented by Chemical Formula 1 is in the range of 2 to 6.

In the loading of the light emitting elements, a viscosity of the second element solvent may have a smaller value than a viscosity of the first element solvent.

Chemical Formula 7

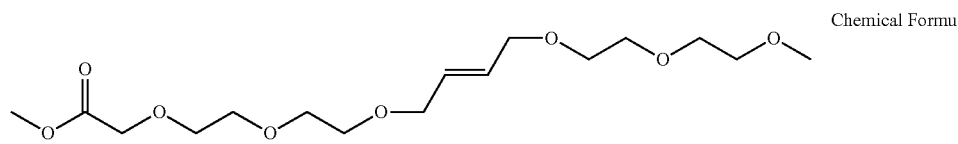

Chemical Formula 8

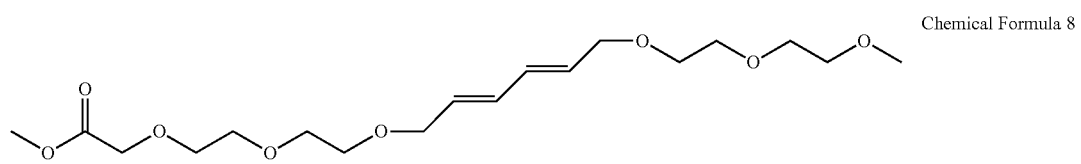

Chemical Formula 9

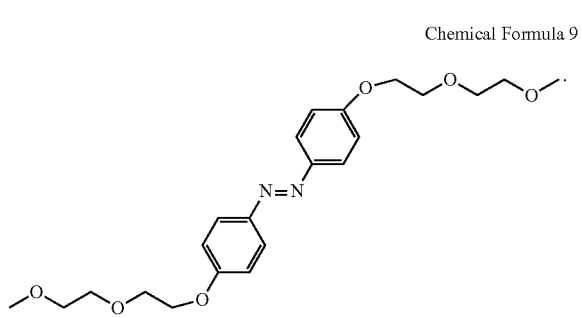

The first element solvent may form the second element solvent as the double bond of the third functional group undergoes a pericyclic reaction.

The first element solvent may comprise at least any one of compounds represented by Chemical Formulae 5 and 6 below:

The first element solvent may have a viscosity of 7 to 15 cp, and the second element solvent may have a viscosity of 5 cp or less.

The loading of the light emitting elements may comprise forming an electric field on the second element solvent, and aligning orientation directions of the light emitting elements by the electric field.

The light emitting elements may extend in one direction, and an acute angle formed by the one direction in which the light emitting elements extend and a direction in which the first electrode and second electrode extend may be in the range of 88 to 90 degrees.

According to an embodiment of the disclosure, a light emitting element solvent, in which light emitting elements comprising semiconductor crystals are dispersed, comprises a first functional group and a second functional group which are represented by Chemical Formula 1 above, and a third functional group which comprises at least one double bond having an isomeric structure and bonded to the first functional group and the second functional group, and the light emitting element solvent comprises at least any one of compounds represented by Chemical Formulae 2 through 6.

The light emitting element solvent may form a first element solvent which comprises the third functional group, wherein the first element solvent may form a second element solvent having a low viscosity as the third functional group undergoes an isomerization reaction.

The light emitting element solvent may comprise at least any one of compounds represented by Chemical Formulae 7 through 11.

The light emitting element solvent may comprise at least any one of compounds represented by Chemical Formulae 7 through 9, wherein the third functional group may form the second element solvent through a cis-trans isomerization reaction.

The light emitting element solvent may comprise at least any one of compounds represented by Chemical Formulae 10 and 11, wherein the third functional group may form the second element solvent through a pericyclic reaction.

According to an embodiment of the disclosure, a light emitting element ink comprises a light emitting element which comprises a semiconductor crystal and an insulating film around an outer peripheral surface of the semiconductor crystal, and a light emitting element solvent in which one or more light emitting elements are dispersed, wherein the light emitting element solvent comprises a first functional group and a second functional group represented by Chemical Formula 1 above and a third functional group comprising at least one double bond having an isomeric structure and bonded to the first functional group and the second functional group, wherein the light emitting element solvent comprises at least any one of compounds represented by Chemical Formulae 2 through 6.

The light emitting element solvent may comprise at least any one of compounds represented by Chemical Formulae 7 through 11.

In the light emitting element solvent, a first element solvent comprising the third functional group may form a second element solvent having a low viscosity as the third functional group undergoes an isomerization reaction.

The semiconductor crystal may comprise a first conductivity type semiconductor which is doped with a first conductivity type, a second conductivity type semiconductor which is doped with a second conductivity type having a different polarity from the first conductivity type, and an active layer which is formed between the first conductivity type semiconductor and the second conductivity type semiconductor.

Further details of other embodiments are included in the detailed description and the accompanying drawings.

A light emitting element solvent according to an embodiment may include a functional group having at least one isomer and thus may be reduced in viscosity as it undergoes an isomerization reaction in response to irradiated light and/or heat. Accordingly, light emitting elements included in a light emitting element ink can be dispersed in the light emitting element solvent having the reduced viscosity.

In addition, in a method for manufacturing a display device according to an embodiment, a process of aligning light emitting elements is performed using a light emitting element solvent with a reduced viscosity in which the light emitting elements are dispersed. Therefore, a display device having an improved degree of alignment of the light emitting elements on electrodes can be manufactured.

The effects according to the embodiments are not limited by the contents described above, and various additional effects are included in this disclosure.

DETAILED DESCRIPTION

The subject matter of the present disclosure will now be described more fully hereinafter with reference to the accompanying drawings, in which example embodiments of the present disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
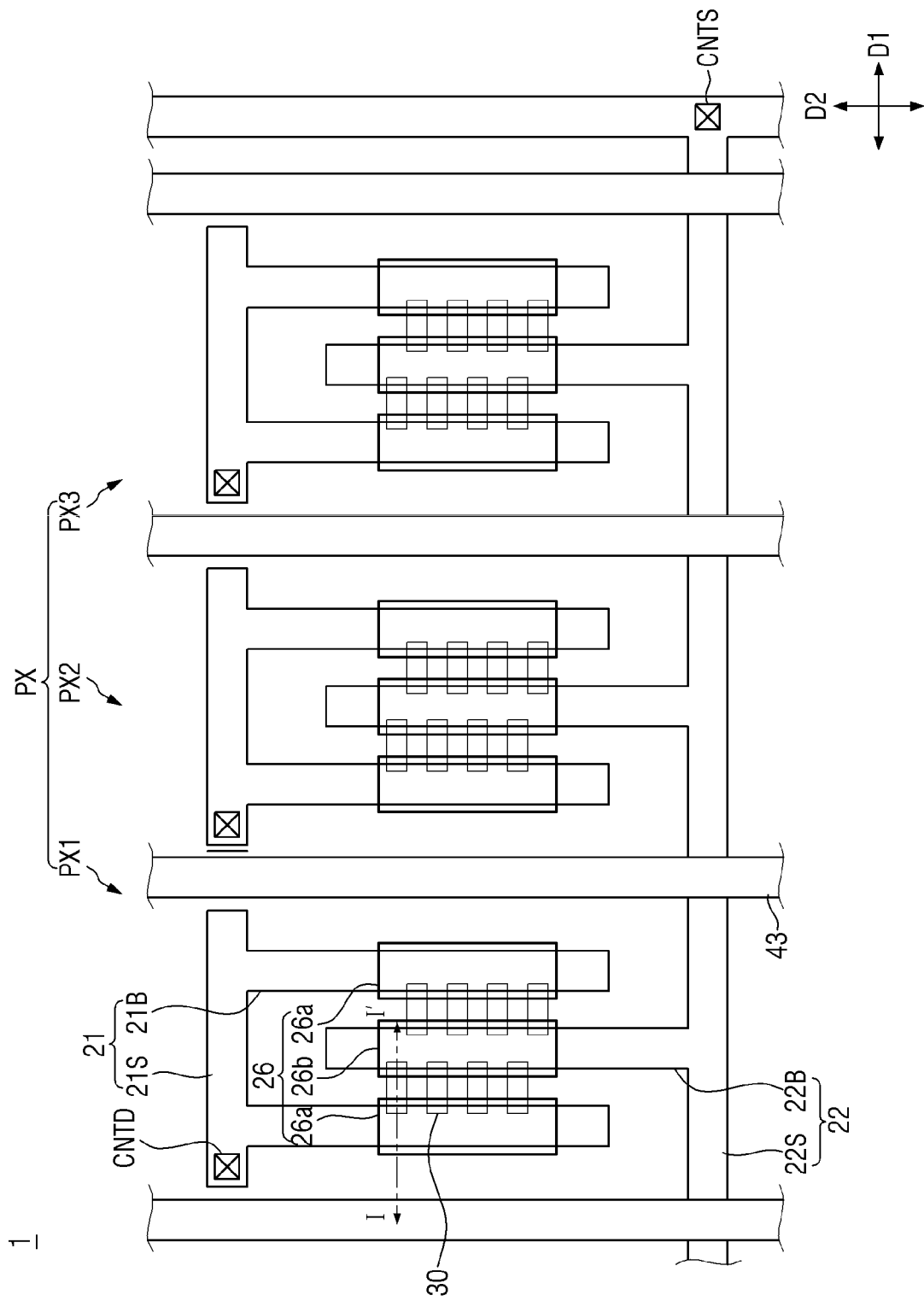
FIG. 1 is a plan view of a display device according to an embodiment.
Figure 2:
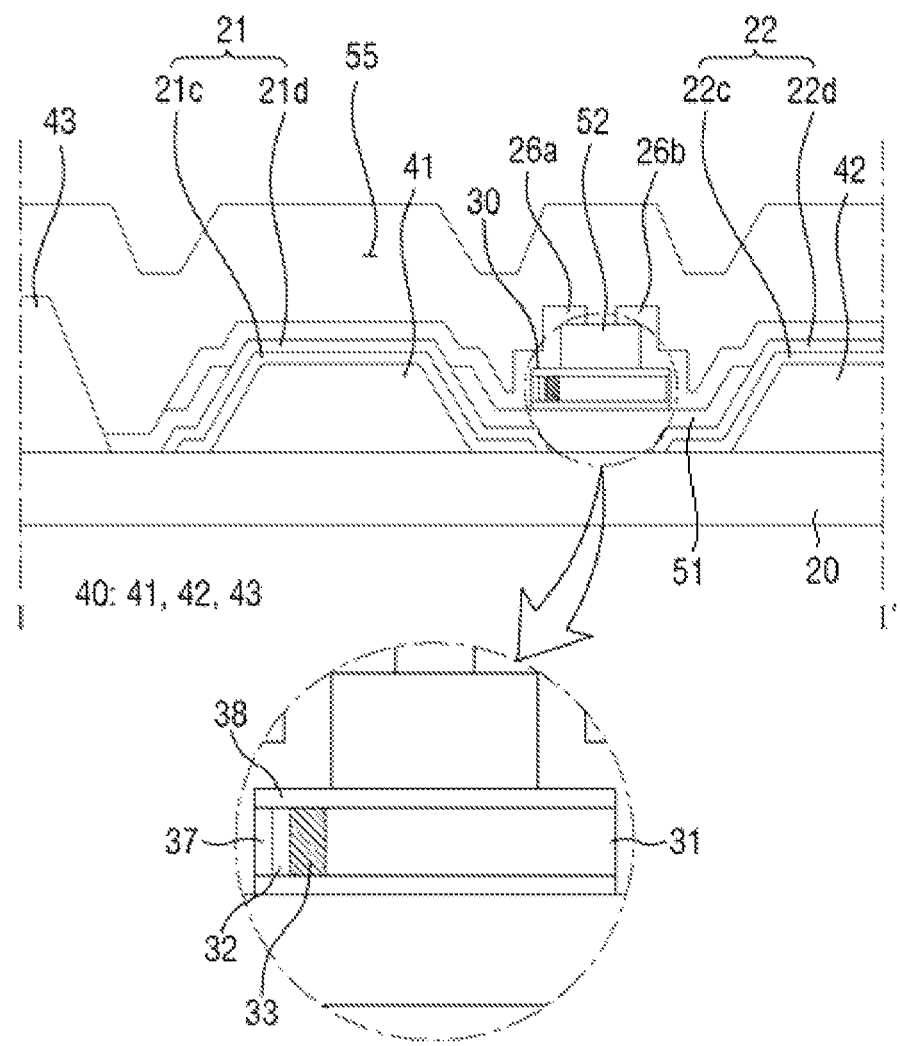
FIG. 2 is a cross-sectional view taken along line I-I' of FIG. 1.

FIG. 1 is a plan view of a display device according to an embodiment. FIG. 2 is a cross-sectional view taken along line I-I' of FIG. 1.

Referring to FIGS. 1 and 2, the display device 1 may include a plurality of pixels PX. Each of the pixels PX may include one or more light emitting elements 30 which emit light of a specific or set wavelength band to display a specific or set color.

Each of the pixels PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. The first color may be red, the second color may be green, and the third color may be blue. However, the present disclosure is not limited thereto, and the subpixels PXn may also emit light of the same color. In addition, although each of the pixels PX includes three subpixels in FIG. 1, the present disclosure is not limited thereto, and each of the pixels PX may also include more subpixels.

It will be understood that, although the terms first, second, third, etc., may be used herein to describe various elements, these elements should not be limited by these terms. These terms are only used to distinguish one element from another element. For example, elements defined as first, second, etc. are not necessarily limited to a specific structure or location and, in some embodiments, may be assigned other numerical terms. Thus, the number assigned to each element may be described through the drawings and the following description, and a first element discussed below could be termed a second element without departing from the teachings of the present disclosure.

Each subpixel PXn of the display device 1 may include areas defined as a display area and a non-display area. The display area is defined as an area in which the light emitting elements 30 included in the display device 1 are disposed to display light of a specific or set wavelength band. The non-display area is an area other than the display area and may be defined as an area in which the light emitting elements 30 are not included and from which no light is output.

Each subpixel PXn of the display device 1 may include a plurality of barriers 40, a plurality of electrodes 21 and 22, and the light emitting elements 30.

The electrodes 21 and 22 may be electrically connected to the light emitting elements 30 and may receive a predetermined or set voltage so that the light emitting elements 30 can emit light. In addition, at least a part of each of the electrodes 21 and 22 may be utilized to form an electric field in a subpixel PXn to align the light emitting elements 30.

The electrodes 21 and 22 may include a first electrode 21 and a second electrode 22. In an embodiment, the first electrode 21 may be a pixel electrode separate for each subpixel PXn, and the second electrode 22 may be a common electrode commonly connected along each subpixel PXn. Any one of the first electrode 21 and the second electrode 22 may be anodes of the light emitting elements 30, and the other may be cathodes of the light emitting elements 30. However, the present disclosure is not limited thereto, and the opposite case may also be true.

Each of the first electrode 21 and the second electrode 22 may include an electrode stem part 21S or 22S extending in a first direction D1 and at least one electrode branch part 21B or 22B extending and branching from the electrode stem part 21S or 22S in a second direction D2 intersecting the first direction D1.

The first electrode 21 may include a first electrode stem part 21S extending in the first direction D1 and at least one first electrode branch part 21B branching from the first electrode stem part 21S and extending in the second direction D2.

The first electrode stem part 21S of any one pixel may have both ends ending between subpixels PXn and spaced apart from ends of neighboring first electrode stem parts 21S, but may lie on substantially the same straight line as the first electrode stem parts 21S of neighboring subpixels (e.g., adjacent in the first direction D1) in the same row. Accordingly, the first electrode stem parts 21S respectively disposed in the subpixels PXn may transmit different electrical signals to the first electrode branch parts 21B, and the first electrode branch parts 21B may be driven separately.

The first electrode branch part 21B may branch from at least a part of the first electrode stem part 21S and extend in the second direction D2 to end at a position spaced apart from a second electrode stem part 22S facing the first electrode stem part 21S.

The second electrode 22 may include the second electrode stem part 22S extending in the first direction D1 and spaced apart from the first electrode stem part 21S to face the first electrode stem part 21S, and a second electrode branch part 22B branching from the second electrode stem part 22S and extending in the second direction D2. However, ends of the second electrode stem part 22S may extend to a plurality of subpixels PXn adjacent in the first direction D1. Accordingly, both ends of the second electrode stem part 22S of any one pixel may be, between the pixels PX, connected to the second electrode stem parts 22S of neighboring pixels.

The second electrode branch part 22B may be spaced apart from the first electrode branch part 21B to face the first electrode branch part 21B and may end at a position spaced apart from the first electrode stem part 21S. For example, an end of the second electrode branch part 22B may be connected to the second electrode stem part 22S, and the other end may be spaced apart from the first electrode stem part 21S in a subpixel PXn.

Although two first electrode branch parts 21B and one second electrode branch part 22B between them are illustrated in the drawing, the present disclosure is not limited thereto.

The barriers 40 may include a third barrier 43 at a boundary between the subpixels PXn and a first barrier 41 and a second barrier 42 under the electrodes 21 and 22, respectively. Although the first barrier 41 and the second barrier 42 are not illustrated in the drawing (e.g., FIG. 1), the first barrier 41 and the second barrier 42 may be under the first electrode branch part 21B and the second electrode branch part 22B, respectively.

The third barrier 43 may be at the boundary between the subpixels PXn. Respective ends of a plurality of first electrode stem parts 21S may be spaced apart from each other by the third barrier 43. The third barrier 43 may extend in the second direction D2 and may be at the boundary between adjacent subpixels PXn arranged in the first direction D1. However, the present disclosure is not limited thereto, and the third barrier 43 may also extend in the first direction D1 and may be at the boundary between subpixels PXn arranged in the second direction D2. The third barrier 43 may be formed of the same material as the first barrier 41 and the second barrier 42 in substantially the same process.

Although not illustrated in the drawing, a first insulating layer 51 may be in each subpixel PXn to entirely cover the subpixel PXn as well as the first electrode branch part 21B and the second electrode branch part 22B. The first insulating layer 51 may protect each of the electrodes 21 and 22 while insulating them from each other so that they do not directly contact each other.

The light emitting elements 30 may be aligned between the first electrode branch part 21B and the second electrode branch part 22B. At least some of the light emitting elements 30 may each have one end electrically connected to the first electrode branch part 21B and the other end electrically connected to the second electrode branch part 22B.

The light emitting elements 30 may be spaced apart from each other in the second direction D2 and may be aligned substantially parallel to each other. A gap between the light emitting elements 30 is not particularly limited. In some embodiments, a plurality of light emitting elements 30 may be disposed adjacent to each other to form a cluster, and a plurality of other light emitting elements 30 may be disposed at regular intervals to form a cluster or may be oriented and aligned in one direction with non-uniform density.

Contact electrodes 26 may be on the first electrode branch part 21B and the second electrode branch part 22B, respectively. However, the contact electrodes 26 may be substantially on the first insulating layer 51, and at least a part of each of the contact electrodes 26 may contact or may be electrically connected to the first electrode branch part 21B or the second electrode branch part 22B.

The contact electrodes 26 may extend in the second direction D2 and may be spaced apart from each other in the first direction D1. Each of the contact electrodes 26 may contact at least one end of the light emitting elements 30 and may contact the first electrode 21 or the second electrode 22 to receive an electrical signal. Accordingly, each of the contact electrodes 26 may send an electrical signal received from the electrode 21 or 22 to the light emitting elements 30.

The contact electrodes 26 may include a first contact electrode 26a and a second contact electrode 26b. The first contact electrode 26a may be on the first electrode branch part 21B and may contact one end of the light emitting elements 30, and the second contact electrode 26b may be on the second electrode branch part 22B and may contact the other end of the light emitting elements 30.

The first electrode stem part 21S and the second electrode stem part 22S may be electrically connected to a circuit device layer of the display device 1 through contact holes, for example, a first electrode contact hole CNTD and a second electrode contact hole CNTS, respectively. Although one second electrode contact hole CNTS is formed in the second electrode stem parts 22S of a plurality of subpixels PXn in the drawing, the present disclosure is not limited thereto. In some embodiments, the second electrode contact hole CNTS may be formed in each subpixel PXn.

In addition, although not illustrated in the drawing (e.g., FIG. 1), the display device 1 may include a second insulating layer 52 (see FIG. 2) and a passivation layer 55 (see FIG. 2) covering each of the electrodes 21 and 22 and at least a part of each light emitting element 30. The structure of the display device 1 will now be described in more detail with reference to FIGS. 1 and 2.

FIG. 2 is a cross-sectional view of the first subpixel PX1, but the same illustration may apply to other pixels PX or subpixels PXn. FIG. 2 illustrates a cross section taken across an end and the other end of a light emitting element 30.

Although not illustrated in FIG. 2, the display device 1 may further include the circuit device layer located under each of the electrodes 21 and 22. The circuit device layer may include a plurality of semiconductor layers and a plurality of conductive patterns, and may include at least one transistor and a power line, which, however, will not be described in more detail below.

Referring to FIG. 2 to describe the display device 1 in more detail, the display device 1 may include a via layer 20 and the electrodes 21 and 22, a light emitting element 30, etc. on the via layer 20. The circuit device layer (not illustrated) may be further under the via layer 20. The via layer 20 may include an organic insulating material and perform a surface planarization function.

The barriers 41 through 43 are on the via layer 20. The barriers 41 through 43 may be spaced apart from each other in each subpixel PXn. The barriers 41 through 43 may include the first barrier 41 and the second barrier 42 adjacent to the center of each subpixel PXn and the third barrier 43 at the boundary between the subpixels PXn.

The third barrier 43 may function to block or reduce the overflow of a device ink 1000 over the boundary of a subpixel PXn when the device ink 1000 is sprayed using an inkjet printing device during the manufacture of the display device 1. In one or more embodiments, when the display device 1 further includes another member, the member may be on the third barrier 43, and thus the third barrier 43 may function to support the member. However, the present disclosure is not limited thereto.

Figure 6:
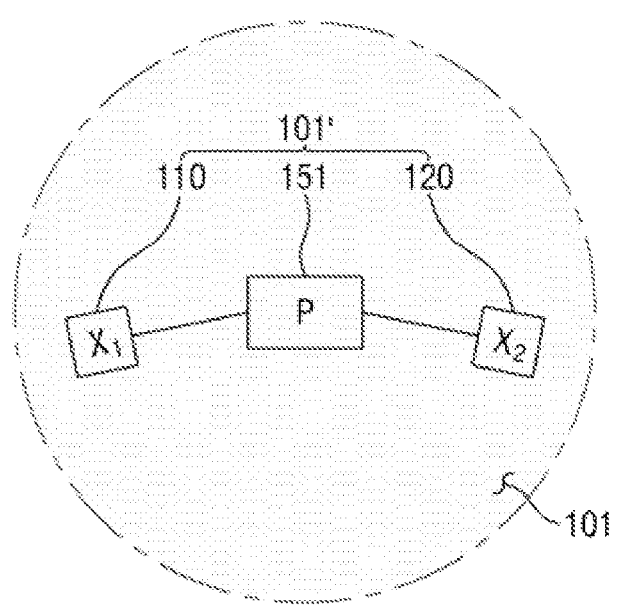
FIGS. 6 and 7 are enlarged views of part A of FIG. 5.

The first barrier 41 and the second barrier 42 are spaced apart to face each other. The first electrode 21 may be on the first barrier 41, and the second electrode 22 may be disposed on the second barrier 42. In FIGS. 2 and 6, it may be understood that the first electrode branch part 21B is on the first barrier 41, and the second electrode branch part 22B is on the second barrier 42.

As described above, the first barrier 41, the second barrier 42, and the third barrier 43 may be formed in substantially the same process. Accordingly, the barriers 41 through 43 may form one grid pattern. The barriers 41 through 43 may include polyimide (PI).

At least a part of each of the barriers 41 through 43 may protrude from the via layer 20. The barriers 41 through 43 may protrude upward from a plane in which the light emitting elements 30 are located, and the protruding part may be at least partially inclined. The shape of the protruding barriers 41 through 43 is not particularly limited. As illustrated in the drawing (e.g., FIG. 2), the first barrier 41 and the second barrier 42 may protrude to the same height, but the third barrier 43 may protrude to a higher position than the first barrier 41 and the second barrier 42.

Reflective layers 21c and 22c may be on the first barrier 41 and the second barrier 42, and electrode layers 21d and 22d may be on the reflective layers 21c and 22c. The reflective layers 21c and 22c and the electrode layers 21d and 22b may constitute the electrodes 21 and 22, respectively.

The reflective layers 21c and 22c include a first reflective layer 21c and a second reflective layer 22c. The first reflective layer 21c may cover the first barrier 41, and the second reflective layer 22c may cover the second barrier 42. A part of each of the reflective layers 21c and 22c is electrically connected to the circuit device layer through a contact hole penetrating the via layer 20.

The reflective layers 21c and 22c may include a material having high reflectivity to reflect light emitted from the light emitting element 30. For example, the reflective layers 21c and 22c may include, but are not limited to, a material such as silver (Ag), copper (Cu), indium tin oxide (ITO), indium zinc oxide (IZO), and/or indium tin zinc oxide (ITZO).

The electrode layers 21d and 22b include a first electrode layer 21d and a second electrode layer 22d. The electrode layers 21d and 22b may have substantially the same pattern as the reflective layers 21c and 22c. The first reflective layer 21c and the first electrode layer 21d are spaced apart from the second reflective layer 22c and the second electrode layer 22d.

The electrode layers 21d and 22b may include a transparent conductive material to allow light emitted from the light emitting element 30 to enter the reflective layers 21c and 22c. For example, the electrode layers 21d and 22b may include, but are not limited to, a material such as indium tin oxide (ITO), indium zinc oxide (IZO), and/or indium tin zinc oxide (ITZO).

In some embodiments, the reflective layers 21c and 22c and the electrode layers 21d and 22b may form a structure in which a transparent conductive layer such as ITO, IZO and/or ITZO and a metal layer such as silver and/or copper are each stacked in one or more layers. For example, the reflective layers 21c and 22c and the electrode layers 21d and 22b may form a stacked structure of ITO/silver (Ag)/ITO/IZO.

In some embodiments, each of the first electrode 21 and the second electrode 22 may be formed as a single layer. For example, the reflective layers 21c and 22c and the electrode layers 21d and 22b may be formed as a single layer to transmit an electrical signal to the light emitting element 30 while reflecting light. For example, each of the first electrode 21 and the second electrode 22 may be, but is not limited to, an alloy containing aluminum (Al), nickel (Ni), lanthanum (La), etc. as a conductive material having high reflectivity.

The first insulating layer 51 partially covers the first electrode 21 and the second electrode 22. The first insulating layer 51 may cover most of upper surfaces of the first electrode 21 and the second electrode 22 but may partially expose the first electrode 21 and the second electrode 22. The first insulating layer 51 may partially cover an area in which the first electrode 21 and the second electrode 22 are spaced apart from each other as well as opposite sides of the first electrode 21 and the second electrode 22 from the above area.

The first insulating layer 51 may expose the relatively flat upper surfaces of the first electrode 21 and the second electrode 22, and the electrodes 21 and 22 may overlap inclined side surfaces of the first barrier 41 and the second barrier 42, respectively. The first insulating layer 51 forms a flat upper surface so that the light emitting element 30 can be located thereon, and the upper surface extends in a direction toward the first electrode 21 and the second electrode 22. The extending part of the first insulating layer 51 ends on inclined side surfaces of the first electrode 21 and the second electrode 22 that face the light emitting element 30. Accordingly, the contact electrodes 26 may contact the exposed first electrode 21 and second electrode 22 and smoothly contact the light emitting element 30 on the flat upper surface of the first insulating layer 51.

The first insulating layer 51 may protect the first electrode 21 and the second electrode 22 while insulating them from each other. In addition, the first insulating layer 51 may prevent or reduce direct contact of the light emitting element 30 on the first insulating layer 51 with other members and thus prevent or reduce damage to the light emitting element 30.

The light emitting element 30 may be disposed on the first insulating layer 51. In the drawing (e.g., in FIG. 2), the light emitting element 30 is on the first insulating layer 51. At least one light emitting element 30 may be on the first insulating layer 51 between the first electrode 21 and the second electrode 22. In the light emitting element 30, a plurality of layers may be located along a direction horizontal to the via layer 20.

The light emitting element 30 of the display device 1 according to the embodiment includes a conductivity type semiconductor and an active layer, and these may be sequentially located along the direction horizontal to the via layer 20. As illustrated in the drawing (e.g., FIG. 2), the light emitting element 30 may include a first conductivity type semiconductor 31, an active layer 33, a second conductivity type semiconductor 32, and a conductive electrode layer 37 located sequentially along the direction horizontal to the via layer 20. However, the present disclosure is not limited thereto. The layers of the light emitting element 30 may also be located in an opposite order. In some embodiments, when the light emitting element 30 has a different structure, the layers may be located along a direction perpendicular (e.g., substantially perpendicular) to the via layer 20.

The second insulating layer 52 may be on a part of the light emitting element 30. The second insulating layer 52 may protect the light emitting element 30, while fixing the light emitting element 30 in a process of manufacturing the display device 1. The second insulating layer 52 may cover an outer surface of the light emitting element 30. For example, a part of the material of the second insulating layer 52 may be between a lower surface of the light emitting element 30 and the first insulating layer 51. The second insulating layer 52 may extend in the second direction D2 between the first electrode branch part 21B and the second electrode branch part 22B to have an island shape or a linear shape in plan view.

The contact electrodes 26 are on the electrodes 21 and 22 and the second insulating layer 52. The first contact electrode 26a and the second contact electrode 26b are spaced apart from each other on the second insulating layer 52. Accordingly, the second insulating layer 52 may insulate the first contact electrode 26a and the second contact electrode 26b from each other.

The first contact electrode 26a may contact the first electrode 21 (exposed by patterning at least the first insulating layer 51) and an end of the light emitting element 30. The second contact electrode 26 may contact the second electrode 22 (exposed by patterning at least the first insulating layer 51) and the other end of the light emitting element 30. The first and second contact electrodes 26a and 26b may contact side surfaces of both ends of the light emitting element 30, for example, the first conductivity type semiconductor 31 and the second conductivity type semiconductor 32 (or the conductive electrode layer 37), respectively. As described above, because the first insulating layer 51 forms the flat upper surface, the contact electrodes 26 can smoothly contact side surfaces of the light emitting element 30.

The contact electrodes 26 may include a conductive material. For example, the conductive electrodes 26 may include, but are not limited to, ITO, IZO, ITZO, and/or aluminum (Al).

The passivation layer 55 is on the second insulating layer 52 and the contact electrodes 26. The passivation layer 55 may function to protect the members on the via layer 20 from an external environment.

Each of the first insulating layer 51, the second insulating layer 52, and the passivation layer 55 described above may include an inorganic insulating material and/or an organic insulating material. In an embodiment, the first insulating layer 51 and the passivation layer 55 may include a material such as silicon oxide (SiOx), silicon nitride (SiNx), silicon oxynitride (SiOxNy), aluminum oxide ($Al_2O_3$), and/or aluminum nitride (AlN). The second insulating layer 52 may include photoresist as an organic insulating material. However, the present disclosure is not limited thereto.

Figure 3:
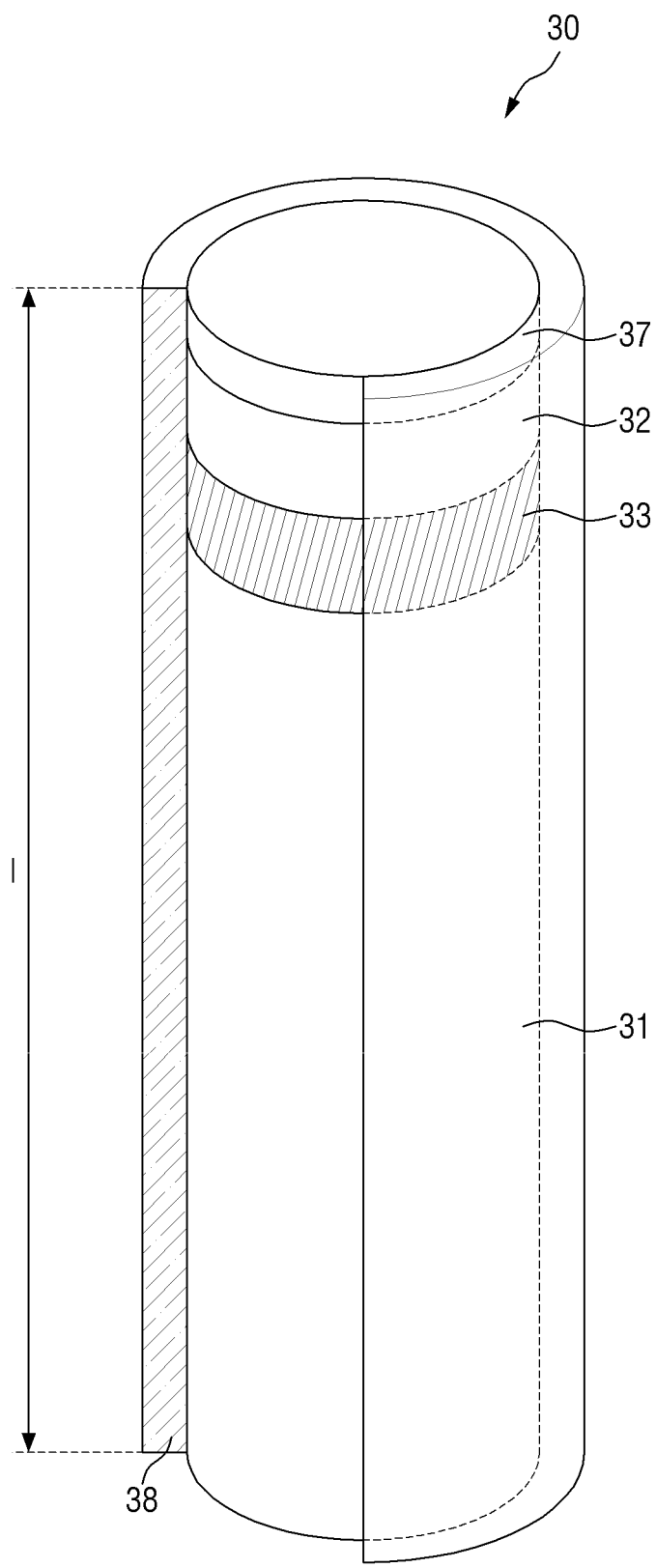
FIG. 3 is a schematic view of the display device according to the embodiment.

FIG. 3 is a schematic view of a light emitting element according to an embodiment.

The light emitting element 30 may be a light emitting diode. For example, the light emitting element 30 may be an inorganic light emitting diode having a size of micrometers or nanometers and made of an inorganic material. When an electric field is formed in a specific or set direction between two electrodes facing each other, the inorganic light emitting diode may be aligned between the two electrodes in which polarities are formed. The light emitting element 30 may be aligned between the electrodes by the electric field formed on the two electrodes.

The light emitting element 30 may extend in one direction. The light emitting element 30 may be shaped like a nanorod, a nanowire, a nanotube, or the like. In an embodiment, the light emitting element 30 may be shaped like a cylinder or a rod. However, the shape of the light emitting element 30 is not limited thereto, and the light emitting element 30 may also have various suitable shapes such as a cube, a rectangular parallelepiped and a hexagonal prism. A plurality of semiconductors to be described further herein below and included in the light emitting element 30 may be sequentially located or stacked along the one direction.

The light emitting element 30 may include a semiconductor crystal doped with impurities of any conductivity type (e.g., a p type or an n type). The semiconductor crystal may receive an electrical signal from an external power source and emit light of a specific or set wavelength band.

The light emitting element 30 according to the embodiment may emit light of a specific or set wavelength band. In an embodiment, light emitted from an active layer 33 may be blue light having a central wavelength band in a range of 450 to 495 nm. However, the central wavelength band of the blue light is not limited to the above range and should be understood to include all suitable wavelength ranges that can be recognized as blue in the art to which the present disclosure pertains. In addition, light emitted from the active layer 33 of the light emitting element 30 is not limited thereto and may also be green light having a central wavelength band in a range of 495 to 570 nm or red light having a central wavelength band in a range of 620 to 750 nm The light emitting element 30 according to the embodiment may include a first conductivity type semiconductor 31, a second conductivity type semiconductor 32, the active layer 33, and an insulating film 38. In addition, the light emitting element 30 according to the embodiment may further include at least one conductive electrode layer 37. Although the light emitting element 30 further includes one conductive electrode layer 37 in FIG. 3, the present disclosure is not limited thereto. In some embodiments, the light emitting element 30 may include more conductive electrode layers 37, or the conductive electrode layer 37 may be omitted. The following description of the light emitting element 30 may apply equally even if the light emitting element 30 includes a different number of conductive electrode layers 37 or further includes another structure.

Referring to FIG. 3, the first conductivity type semiconductor 31 may be, for example, an n-type semiconductor having a first conductivity type. In an example, when the light emitting element 30 emits light in a blue wavelength band, the first conductivity type semiconductor 31 may include a semiconductor material having a chemical formula of $Al_xGa_yIn_{1-x-y}N$ ($0 \leq x \leq 1$, $0 \leq y \leq 1$, $0 \leq x+y \leq 1$), for example, may be any one or more of n-type doped AlGaInN, GaN, AlGaN, InGaN, AlN, and InN. The first conductivity type semiconductor 31 may be doped with a first conductive dopant, and the first conductive dopant may be, for example, Si, Ge, and/or Sn. In an embodiment, the first conductivity type semiconductor 31 may be n-GaN doped with n-type Si. A length of the first conductivity type semiconductor 31 may be in a range of, but not limited to, 1.5 to 5 μm.

The second conductivity type semiconductor 32 is disposed on the active layer 33 to be described further herein below. The second conductivity type semiconductor 32 may be, for example, a p-type semiconductor having a second conductivity type. In an example, when the light emitting element 30 emits light in a blue or green wavelength band, the second conductivity type semiconductor 32 may include a semiconductor material having a chemical formula of $Al_xGa_yIn_{1-x-y}N$ ($0 \leq x \leq 1$, $0 \leq y \leq 1$, $0 \leq x+y \leq 1$), for example, may be any one or more of p-type doped AlGaInN, GaN, AlGaN, InGaN, AlN, and InN. The second conductivity type semiconductor 32 may be doped with a second conductive dopant, and the second conductive dopant may be, for example, Mg, Zn, Ca, Se, or Ba. In an embodiment, the second conductivity type semiconductor 32 may be p-GaN doped with p-type Mg. A length of the second conductivity type semiconductor 32 may be in a range of, but not limited to, 0.08 to 0.25 μm.

Although each of the first conductivity type semiconductor 31 and the second conductivity type semiconductor 32 is composed of one layer in the drawing, the present disclosure is not limited thereto. In some embodiments, each of the first conductivity type semiconductor 31 and the second conductivity type semiconductor 32 may include more layers, for example, may further include a clad layer and/or a tensile strain barrier reducing (TSBR) layer, depending on the material of the active layer 33.

The active layer 33 is between the first conductivity type semiconductor 31 and the second conductivity type semiconductor 32. The active layer 33 may include a material having a single or multiple quantum well structure. When the active layer 33 includes a material having a multiple quantum well structure, it may have a structure in which a plurality of quantum layers and a plurality of well layers are alternately stacked. The active layer 33 may emit light through combination of electron-hole pairs according to an electrical signal received through the first conductivity type semiconductor 31 and the second conductivity type semiconductor 32. For example, when the active layer 33 emits light in the blue wavelength band, it may include a material such as AlGaN and/or AlGaInN. In one or more embodiments, when the active layer 33 has a multiple quantum well structure in which a quantum layer and a well layer are alternately stacked, the quantum layer may include a material such as AlGaN and/or AlGaInN, and the well layer may include a material such as GaN and/or AlInN. In an embodiment, the active layer 33 may include AlGaInN as a quantum layer and AlInN as a well layer to emit blue light having a central wavelength band is in a range of 450 to 495 nm as described above.

However, the present disclosure is not limited thereto, and the active layer 33 may also have a structure in which a semiconductor material having a large band gap energy and a semiconductor material having a small band gap energy are alternately stacked or may include different group 3 to 5 semiconductor materials depending on the wavelength band of light that it emits. Light emitted from the active layer 33 is not limited to light in the blue wavelength band. In some embodiments, the active layer 33 may emit light in a red or green wavelength band. A length of the active layer 33 may be in a range of, but not limited to, 0.05 to 0.25 μm.

Light emitted from the active layer 33 may be radiated not only to an outer surface of the light emitting element 30 in a longitudinal direction, but also to both side surfaces. The direction of light emitted from the active layer 33 is not limited to one direction.

The conductive electrode layer 37 may be an ohmic contact electrode. However, the present disclosure is not limited thereto, and the conductive electrode layer 37 may also be a Schottky contact electrode. The conductive electrode layer 37 may include a conductive metal. For example, the conductive electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO). In addition, the conductive electrode layer 37 may include an n-type or p-type doped semiconductor material. The conductive electrode layer 37 may include the same material or different materials, but the present disclosure is not limited thereto.

The insulating film 38 surrounds outer surfaces of the semiconductors described above. In an embodiment, the insulating film 38 may surround an outer surface of at least the active layer 33 and extend in the direction in which the light emitting element 30 extends. The insulating film 38 may protect the above members. For example, the insulating film 38 may surround side surfaces of the above members but may expose both ends of the light emitting element 30 in the longitudinal direction.

In the drawing (e.g., in FIG. 3), the insulating film 38 extends in the longitudinal direction of the light emitting element 30 to cover from the first conductivity type semiconductor 31 to the conductive electrode layer 37. However, the present disclosure is not limited thereto, and the insulating film 38 may also cover outer surfaces of only some conductivity type semiconductors as well as the active layer 33, or may cover only a part of an outer surface of the conductive electrode layer 37 to partially expose the outer surface of the conductive electrode layer 37.

A thickness of the insulating film 38 may be in a range of, but not limited to, 10 nm to 1.0 μm. The thickness of the insulating film 38 may be, for example, 40 nm.

The insulating film 38 may include a material having insulating properties such as silicon oxide ($SiO_x$), silicon nitride ($SiN_x$), silicon oxynitride ($SiO_xN_y$), aluminum nitride (AlN), and/or aluminum oxide ($Al_2O_3$). Therefore, the insulating film 38 can prevent an electrical short circuit that may occur when the active layer 33 directly contacts an electrode through which an electrical signal is transmitted to the light emitting element 30 (or may reduce a likelihood or degree of such an electrical short circuit). In addition, the insulating film 38 can prevent or reduce a reduction in luminous efficiency by protecting the outer surface of the light emitting element 30 including the active layer 33.

In addition, in some embodiments, an outer surface of the insulating film 38 may be treated. When the display device 1 is manufactured, the light emitting element 30 may be sprayed on electrodes in a state in which it is dispersed in a set or predetermined ink and then may be aligned. Here, the surface of the insulating film 38 may be hydrophobic or hydrophilic-treated so that the light emitting element 30 remains separate from other adjacent light emitting elements 30 in the ink without being agglomerated with them.

A length l of the light emitting element 30 may be in a range of 1 to 10 μm or 2 to 6 μm, and may for example be in a range of 4 to 5 μm. In addition, a diameter of the light emitting element 30 may be in a range of 300 to 700 nm, and an aspect ratio of the light emitting element 30 may be 1.2 to 100. However, the present disclosure is not limited thereto, and a plurality of light emitting elements 30 included in the display device 1 may also have different diameters according to a difference in composition of the active layer 33. The diameter of the light emitting element 30 may for example be about 500 nm.

The light emitting element 30 is not limited to the structure illustrated in FIG. 3 and may also have other suitable structures.

Figure 4:
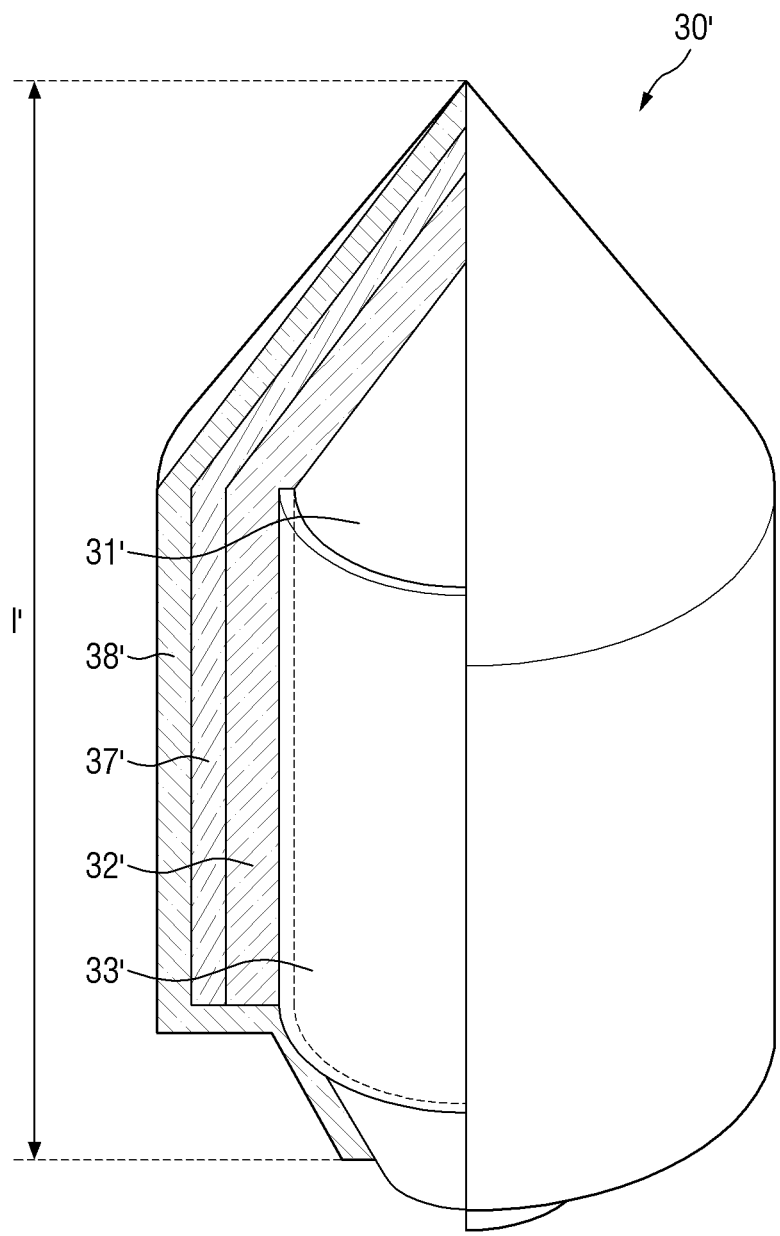
FIG. 4 is a schematic view of a light emitting element according to another embodiment.

FIG. 4 is a schematic view of a light emitting element according to another embodiment.

Referring to FIG. 4, in the light emitting element 30', a plurality of layers may not be stacked in one direction, but each layer may be formed to surround an outer surface of another layer. The light emitting element 30' of FIG. 4 is the same as the light emitting element 30 of FIG. 3 except for the shape of each layer. Thus, any redundant description will be omitted, and differences will be described below.

According to an embodiment, a first conductivity type semiconductor 31' may extend in one direction and have both ends inclined toward the center. The first conductivity type semiconductor 31' of FIG. 28 may have a rod-shaped or cylindrical body and conical ends formed on and under the body, respectively. An upper end of the body may have a steeper slope than a lower end.

An active layer 33' surrounds an outer surface of the body of the first conductivity type semiconductor 31'. The active layer 33' may have a ring shape extending in a direction. The active layer 33' is not formed on the upper and lower ends of the first conductivity type semiconductor 31'. For example, the active layer 33' may contact only straight side surfaces of the first conductivity type semiconductor 31'.

A second conductivity type semiconductor 32' surrounds an outer surface of the active layer 33' and the upper end of the first conductivity type semiconductor 31'. The second conductivity type semiconductor 32' may include a ring-shaped body extending in a direction and an upper end having inclined side surfaces. For example, the second conductivity type semiconductor 32' may directly contact straight side surfaces of the active layer 33' and the inclined upper end of the first conductivity type semiconductor 31'. However, the second conductivity type semiconductor 32' is not formed on the lower end of the first conductivity type semiconductor 31'.

An electrode material layer 37' surrounds an outer surface of the second conductivity type semiconductor 32'. For example, the shape of the electrode material layer 37' may be substantially the same as that of the second conductivity type semiconductor 32'. In one or more embodiments, the electrode material layer 37' may contact the entire outer surface of the second conductivity type semiconductor 32'.

An insulating film 38' may surround outer surfaces of the electrode material layer 37' and the first conductivity type semiconductor 31'. The insulating film 38' may directly contact not only the electrode material layer 37' but also the lower end of the first conductivity type semiconductor 31' and exposed lower ends of the active layer 33' and the second conductivity type semiconductor 32'.

The display device 1 described above may be manufactured such that the light emitting element 30 is between the electrodes 21 and 22. A plurality of light emitting elements 30 may be aligned between the electrodes 21 and 22 in each pixel PX or subpixel PXn and may emit light of a specific or set wavelength band in response to an electrical signal received from the electrodes 21 and 22.

For example, the light emitting elements 30 may be aligned between the electrodes 21 and 22 using a dielectrophoretic method. When the device ink 1000 including an element solvent 100 (see FIG. 5) in which the light emitting elements 30 are dispersed is sprayed onto the electrodes 21 and 22 and alternating current (AC) power is applied through the electrodes 21 and 22, an electric field is formed on the device ink 1000 by the AC power. The light emitting elements 30 are subjected to a dielectrophoretic force applied by the electric field. Thus, the light emitting elements 30 subjected to the dielectrophoretic force may be between the electrodes 21 and 22 or on the electrodes 21 and 22.

Figure 5:
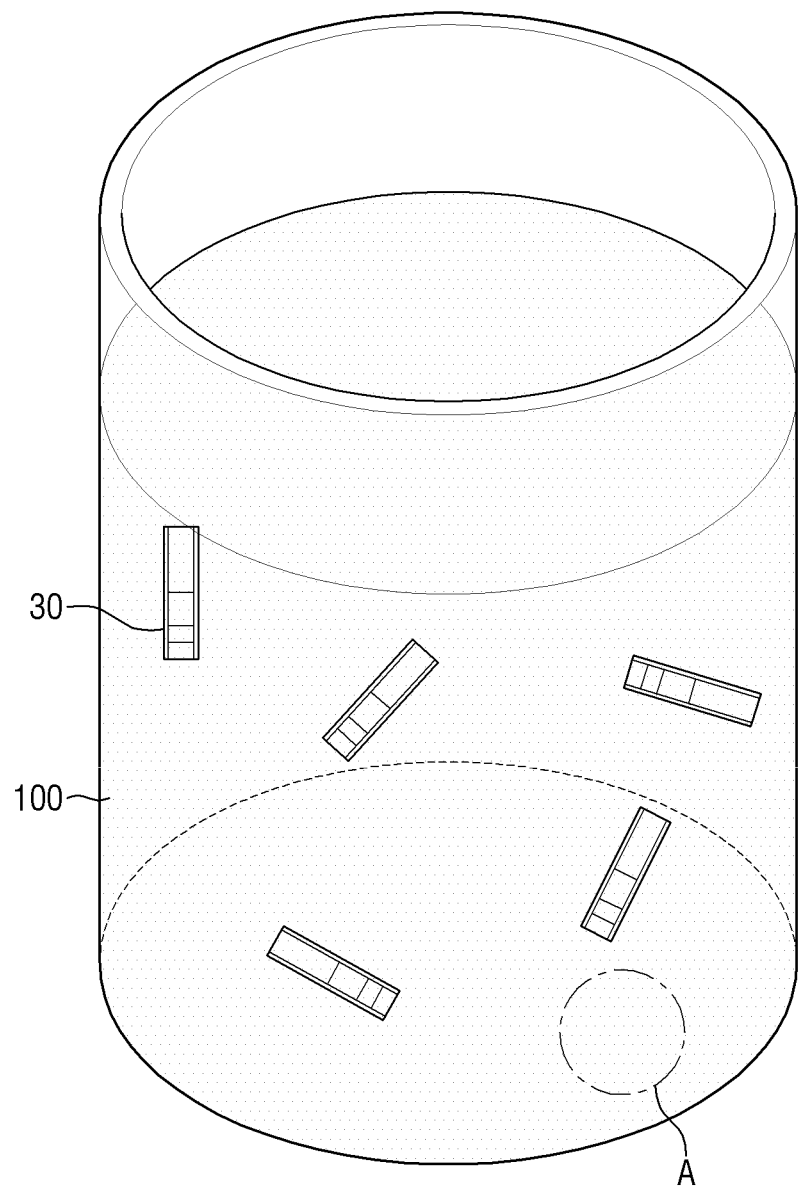
FIG. 5 is a schematic view of a device ink according to an embodiment.

FIG. 5 is a schematic view of a device ink according to an embodiment.

Referring to FIG. 5, the device ink 1000 includes light emitting elements 30 and an element solvent 100. Each of the light emitting elements 30 may be the light emitting element 30 or 30' of FIG. 3 or 4 described above, and the light emitting element 30 of FIG. 3 is illustrated in the drawing (e.g., FIG. 5). The light emitting elements 30 may be prepared in a state in which they are dispersed in the element solvent 100. A detailed description of the light emitting elements 30 is the same as the above description.

The light emitting elements 30 have a relatively large specific gravity because they include semiconductor crystals. The element solvent 100 according to an embodiment may include a material having a high viscosity so that the light emitting elements 30 can be dispersed therein. The device ink 1000 may be sprayed on the electrodes 21 and 22 through an inkjet printing device, and the element solvent 100 may have a viscosity that can keep the light emitting elements 30 dispersed for a certain period of time. In an embodiment, the viscosity of the element solvent 100 may be in the range of, but not limited to, 7 to 15 cp. The element solvent 100 may include an organic solvent or an inorganic solvent, may be removed in a subsequent process as will be described further herein below, and may include a material that does not damage the semiconductor crystals of the light emitting elements 30.

When the light emitting elements 30 are placed on the electrodes 21 and 22, the element solvent 100 in which the light emitting elements 30 are dispersed may be removed by heating or a subsequent treatment process. Here, the element solvent 100 may include a compound having a large molecular weight and thus have a high viscosity so that the light emitting elements 30 having a relatively large specific gravity can be kept dispersed. Accordingly, the element solvent 100 may not be completely removed in a subsequent treatment process but may remain as a foreign substance on the electrodes 21 and 22 or the light emitting elements 30. In addition, when the element solvent 100 includes the compound that has a viscosity of a certain level or higher, a dielectrophoretic force applied by an electric field may not be sufficient. Therefore, the light emitting elements 30 may not be smoothly aligned on the electrodes 21 and 22, or the alignment state of the light emitting elements 30 may be changed in the process of removing the element solvent 100.

According to an embodiment of the present disclosure, the element solvent 100 may include a functional group including at least one double bond having an isomeric structure. The viscosity of the element solvent 100 may vary according to the isomeric structure of the functional group. For example, in the manufacturing process of the display device 1, the element solvent 100 may form a first element solvent 101 having a high viscosity or a second element solvent 102 having a low viscosity according to the isomeric structure of the functional group.

Figure 7:
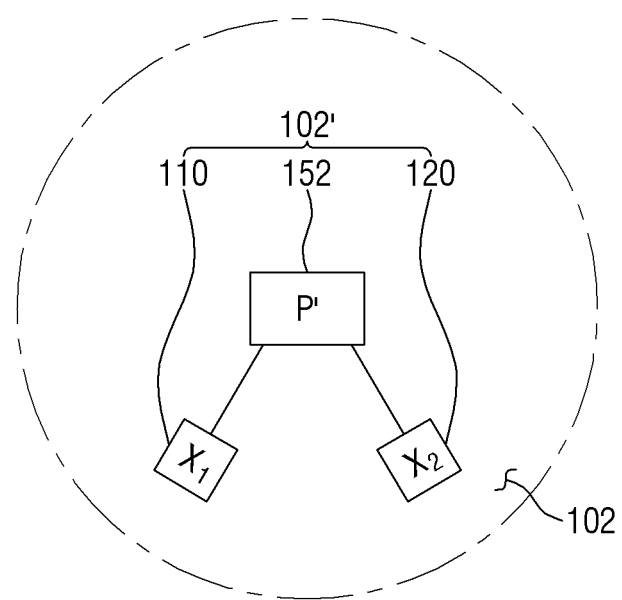

FIGS. 6 and 7 are enlarged views of part A of FIG. 5.

FIG. 6 illustrates the first element solvent 101 formed from the element solvent 100, and FIG. 7 illustrates the second element solvent 102 formed from the element solvent 100.

In the present specification, it may be understood that the 'element solvent 100' refers to a solvent in which the light emitting elements 30 can be dispersed or a medium thereof, and 'device solvent molecules 100'' refer to chemical molecules constituting the element solvent 100. As will be described further herein below, the 'element solvent 100' may form the 'first element solvent 101' or the 'second element solvent 102' depending on the state of the 'device solvent molecules 100'', and it may be understood that the first element solvent 101 is composed of 'first element solvent molecules 101'' and the second element solvent 102 is composed of 'second element solvent molecules 102''.

In one or more embodiments, the element solvent 100 of FIG. 5 may be the first element solvent 101 composed of the first element solvent molecules 101' of FIG. 6, and the second element solvent molecules 102' of FIG. 7 may constitute the second element solvent 102. However, these terms may not necessarily be used separately. In some embodiments, the terms 'element solvent 100' and 'device solvent molecules 101'' may be used interchangeably and may have substantially the same meaning. The device solvent molecules 100' of the element solvent 100 will now be described in more detail.

Referring to FIGS. 6 and 7, a device solvent molecule 100' may include a first functional group 110, a second functional group 120, and a third functional group 150.

The first functional group 110 (X1) and the second functional group 120 (X2) may be functional groups having a molecular weight of a certain level or higher so that the light emitting elements 30 can be dispersed. The type (or kind) and structure of the first functional group 110 and the second functional group 120 are not particularly limited as long as the first functional group 110 and the second functional group 120 can disperse the light emitting elements 30 without reacting with them and can be removed in a subsequent process. For example, each of the first functional group 110 and the second functional group 120 may be, but is not limited to, a non-polar functional group having a carbon chain or a polar functional group including oxygen (O) and/or nitrogen (N) atoms in a carbon chain.

In an embodiment, the first functional group 110 and the second functional group 120 may include a functional group having the same structure. The first functional group 110 and the second functional group 120 may have substantially the same molecular structure by including a functional group in which monomers of the same structure are repeatedly bonded. However, the present disclosure is not limited thereto, and the first functional group 110 and the second functional group 120 may also be different in the number of repetitions of the monomer and, in some embodiments, may have opposite polarities. This will be described in further detail herein below.

The third functional group 150 (P or P') may be bonded to the first functional group 110 and the second functional group 120 and may be a functional group having an isomer by including at least one double bond. When irradiated with light and/or heat, the third functional group 150 (P) may be isomerized from a first isomer 151 (see FIG. 6) to a second isomer 152 (see FIG. 7). The third functional group 150 (P) of the first isomer 151 may form the first element solvent 101, and the third functional group 150 (P') of the second isomer 152 may form the second element solvent 102.

The third functional group 150 may have a different dispersion force or polarity acting between adjacent molecules according to the molecular structure of the first and second isomers 151 and 152. The second isomer 152 of the third functional group 150 may have a relatively weak intermolecular attraction compared with the first isomer 151. For example, the second element solvent 102 including the second isomer 152 may have a smaller intermolecular attraction and a lower viscosity and boiling point than the first element solvent 101 including the first isomer 151.

As the first element solvent 101 is irradiated with light and/or heat, it may form the second element solvent 102 having a low viscosity. In an embodiment, the first element solvent 101 may have a viscosity of 7 to 15 cp, and the second element solvent 102 may have a viscosity of 5 cp or less. However, the present disclosure is not limited thereto.

As described above, when the display device 1 is manufactured, an operation of spraying the device ink 1000, aligning the light emitting elements 30 on the electrodes 21 and 22, and then removing the element solvent 100 may be performed. Here, if the element solvent 100 is the first element solvent 101 having a high viscosity by including the first element solvent molecule 101', when an electric field is formed in the device ink 1000, a relatively weak dielectrophoretic force may be applied to the light emitting elements 30. Accordingly, the light emitting elements 30 may not be accurately aligned on the electrodes 21 and 22. In addition, the first element solvent 101 may remain as a foreign substance without being completely removed in the removing of the element solvent 100.

According to an embodiment, a method for manufacturing the display device 1 includes forming the second element solvent 102 having a low viscosity by irradiating light and/or heat to the first element solvent 101. Because the element solvent 100 according to the embodiment includes the third functional group 150 that can be isomerized by irradiated light and/or heat, its viscosity and boiling point may be reduced by the light and/or heat.

The first element solvent molecule 101' is isomerized to form the second element solvent molecule 102' by irradiating light and/or heat to the element solvent 100, e.g., the first element solvent 101 sprayed on the electrodes 21 and 22. The second element solvent molecule 102' may be structured to have a relatively low intermolecular attraction, and the second element solvent 102 thus formed may have a low viscosity and boiling point.

When an electric field is formed in the device ink 1000 after the second element solvent 102 is formed, a strong dielectrophoretic force may be applied to the light emitting elements 30, and thus the light emitting elements 30 may be placed on the electrodes 21 and 22 with a high degree of alignment. In addition, the second element solvent 102 may be easily removed in a subsequent low-temperature heat treatment process, thereby minimizing or reducing a change in the alignment state of the light emitting elements 30 on the electrodes 21 and 22. For example, the element solvent 100 may have a viscosity that allows the light emitting elements 30 to be dispersed and to be sprayed from a nozzle while being kept dispersed, but may have a molecular structure that may cause its viscosity to be reduced in a subsequent process. This will be described in more detail herein below.

The device solvent molecule 100' according to an embodiment may have a structure of Formula 1 below:

$$X1-P-X2, \qquad \text{Formula 1}$$

where P is the third functional group 150, X1 is the first functional group 110, and X2 is the second functional group 120.

Referring to Formula 1, the device solvent molecule 100' of the element solvent 100 according to the embodiment may include the third functional group 150 (P) and at least one functional group bonded to the third functional group 150 (P), for example, the first functional group 110 (X1) and the second functional group 120 (X2). The third functional group 150 (P) may include the first isomer 151 and the second isomer 152, and the substitution positions of or the distance between the first functional group 110 (X1) and the second functional group 120 (X2) may vary according to the structure of the first and second isomers 151 and 152 of the third functional group 150.

For example, when the third functional group 150 (P) has the structure of the first isomer 151 in a first state, the first functional group 110 and the second functional group 120 may be located relatively far away from each other or may be substituted at opposite positions relative to the third functional group 150. In this case, the first element solvent molecule 101' may have a molecular structure with a relatively large surface area and have an increased dispersion force, resulting in a large intermolecular attraction and a high viscosity and boiling point. On the other hand, when the functional group 150 (P') has the structure of the second isomer 152 in a second state, the first functional group 110 and the second functional group 120 may be located relatively close to each other or may be substituted at positions adjacent to each other on the third functional group 150. In this case, the second element solvent molecule 102' may have a molecular structure with a relatively small surface area and have a reduced dispersion force, resulting in a reduced intermolecular attraction and a reduced viscosity and boiling point.

In the manufacturing process of the display device 1, after the light emitting elements 30 dispersed in the first element solvent 101 are sprayed, the second element solvent 102 may be formed so that the light emitting elements 30 can be aligned on the electrodes 21 and 22 in a low-viscosity state and then may be removed by volatilization at a relatively low temperature. The display device 1 thus manufactured includes the light emitting elements 30 having a high degree of alignment, and the reliability of the display device 1 can be improved by removing foreign substances that may be formed on the electrodes 21 and 22.

The third functional group 150 may include at least one double bond capable of an isomerization reaction. In an embodiment, the third functional group 150 may be a functional group capable of a cis-trans isomerization reaction or a pericyclic reaction. For example, the third functional group 150 may be any one of an alkene group, a dialkene group, and an azobenzene group capable of a cis-trans isomerization reaction or may be a 1,3-butadiene group or a 1,3,6-trihexene group capable of a pericyclic reaction. However, the present disclosure is not limited thereto.

When the third functional group 150 includes a functional group capable of a cis-trans isomerization reaction, its molecular structure may be changed from a trans-isomer structure to a cis-isomer structure by irradiated light as shown in Chemical Reaction Formulae 1 through 3 below. Substituents substituted in the third functional group 150 are substituted closer to each other in the cis-isomer than in the trans-isomer. Accordingly, the device solvent molecule 100' may be structured to have a relatively small surface area and may have a reduced intermolecular attraction, resulting in a reduced viscosity and boiling point.

fixed at substitution positions closer to each other in the closed-chain state than in the open-chain state. Accordingly, the device solvent molecule 100' having the third functional group 150 in the closed-chain state may be structured to have a relatively small surface area and may have a reduced intermolecular attraction, resulting in a reduced viscosity and boiling point. This may be understood in the same way as described above.

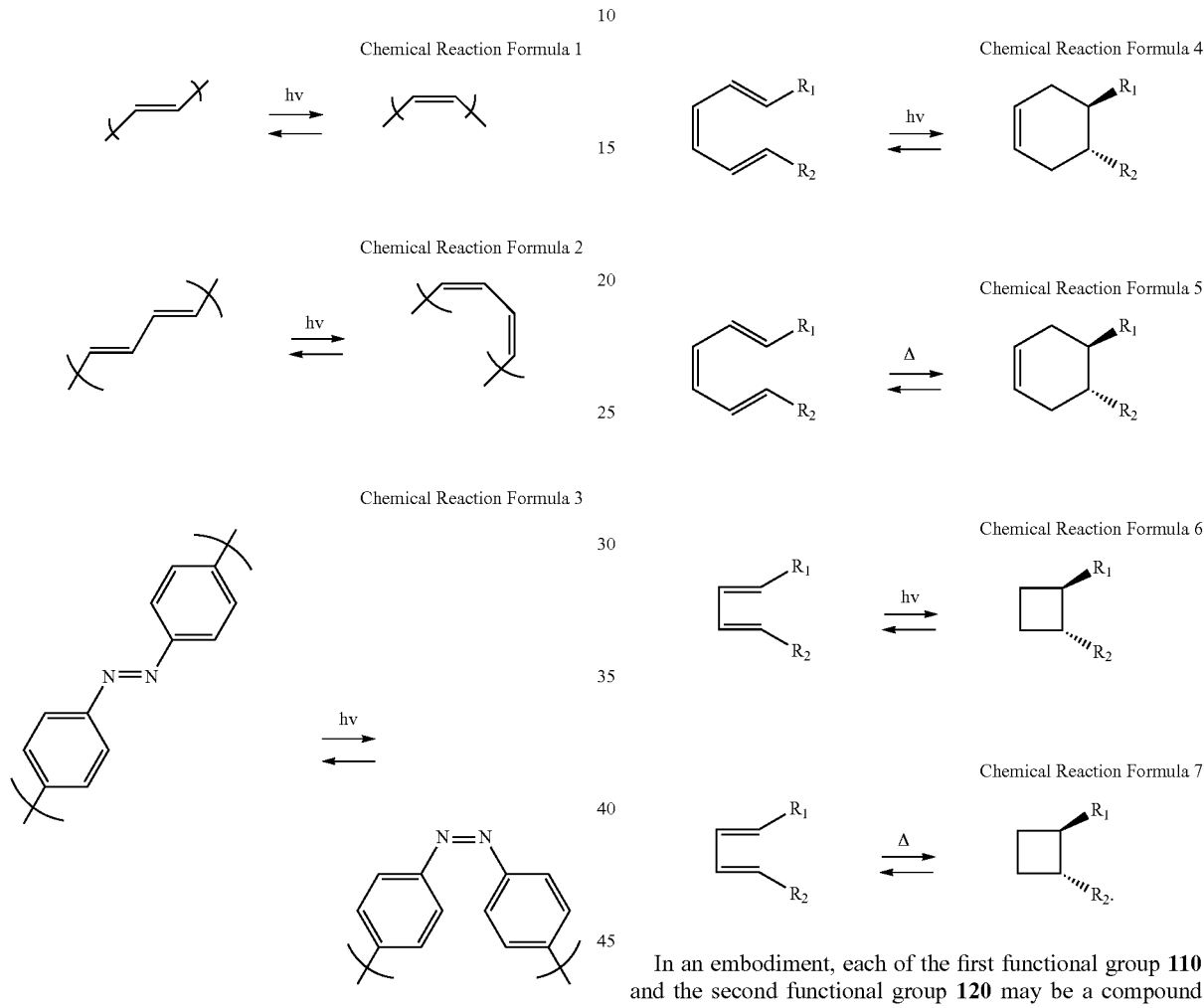

For example, as shown in Chemical Reaction Formula 3, when the third functional group 150 has an azobenzene group, substituents substituted at the 4-position of a benzene group by light irradiation are located closer to each other in a cis-isomer state than in a trans-isomer state. In the case of having the azobenzene group as the third functional group 150, the device solvent molecule 100' may be reduced in surface area and thus reduced in intermolecular attraction when the azobenzene group is in the cis-isomer state, and the viscosity and boiling point of the element solvent 100 may be reduced. Chemical Reaction Formulae 1 and 2 may also be understood in the same way.

In addition, when the third functional group 150 includes a functional group capable of a pericyclic reaction, it may undergo intramolecular cycloaddition by irradiated light and/or heat as shown in Chemical Reaction Formulae 4 through 7 below. The third functional group may be isomerized from an open-chain state to a closed-chain state. Substituents substituted in the third functional group 150 are In an embodiment, each of the first functional group 110 and the second functional group 120 may be a compound represented by Chemical Formula 1 below:

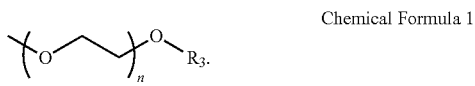

Chemical Formula 1

In Chemical Formula 1, n is an integer of 1 to 5, and $R_3$ is any one of a $C_1$-$C_5$ alkyl group, a $C_2$-$C_5$ alkenyl group, a $C_2$-$C_5$ alkynyl group, a $C_1$-$C_5$ alkyl ether group, a $C_2$-$C_5$ alkenyl ether group, and a $C_2$-$C_5$ alkyl ester group.

Each of the first functional group 110 and the second functional group 120 may include at least one ethylene glycol (—$OCH_2CH_2O$—) monomer as shown in Chemical Formula 1 above. The first functional group 110 and the second functional group 120 may be bonded to the third functional group 150 so that the element solvent 100 can have a molecular weight and viscosity sufficient to disperse the light emitting elements 30. The value of n of each of the first and second functional groups 110 and 120 means the number of repeating units of the ethylene glycol monomer and may be an integer of 1 to 5 although it is not particularly limited.

In one or more embodiments, in the device solvent molecule 100', the sum (n1+n2) of the value (n1) of n of the first functional group 110 and the value (n2) of n of the second functional group 120 may be in a range of 2 to 6. In one device solvent molecule 100', the number of ethylene glycol monomers included in the first functional group 110 and the second functional group 120 may be in a range to 2 to 6. When the sum (n1+n2) of the value (n1) of n of the first functional group 110 and the value (n2) of n of the second functional group 120 is 2 or less, the first element solvent molecule 101' may not have a sufficient molecular weight and viscosity. Thus, the light emitting elements 30 may not be kept dispersed. When the sum (n1+n2) of the value (n1) of n of the first functional group 110 and the value (n2) of n of the second functional group 120 is greater than 6, the molecular weight and viscosity may have a large value even when the third functional group 150 is in the state of the second isomer 152, and the dielectrophoretic reactivity of the light emitting elements 30 may be reduced.

In an embodiment, the device solvent molecule 100' may be any one of compounds represented by Chemical Formulae 2 through 6 below:

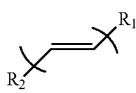

Chemical Formula 2

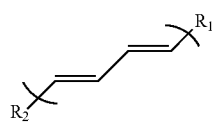

Chemical Formula 3

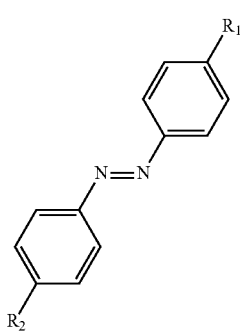

Chemical Formula 4

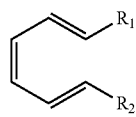

Chemical Formula 5

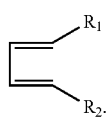

Chemical Formula 6

In Chemical Formulae 2 through 6, $R_1$ and $R_2$ are represented by Chemical Formula 1, and the sum of an n value (n1) of $R_1$ and an n value (n2) of $R_2$ represented by Chemical Formula 1 is in a range of 2 to 6.

Referring to Chemical Formulae 2 through 6, the element solvent 100 includes a functional group capable of an isomerization reaction when irradiated with light and/or heat and includes at least one functional group represented by Chemical Formula 1. In Chemical Formulae 2 through 6, $R_1$ and $R_2$ may include a compound represented by Chemical Formula 1 and may be the first functional group 110 and the second functional group 120 of the device solvent molecule 100', respectively. $R_1$ and $R_2$, for example, the first functional group 110 and the second functional group 120, are the same as those described above.

For example, in the case of a compound of Chemical Formula 4, an azobenzene group may be included as a functional group capable of an isomerization reaction by light irradiation, and the first functional group 110 and the second functional group 120 may include a functional group in which ethylene glycol (—OCH$_2$CH$_2$O—) monomers are repeated.

In Chemical Formula 4, a nitrogen-nitrogen double bond of an azobenzene group may be changed from a trans-isomer structure to a cis-isomer structure by light irradiation. A cis-azobenzene group may be substituted at the 4-position of each benzene group, and functional groups in which ethylene glycol (—OCH$_2$CH$_2$O—) monomers are repeated may be located close to each other. For example, the first isomer 151 of the first element solvent molecule 101' may be a trans-azobenzene group, the second isomer 152 of the second element solvent molecule 102' may be a cis-azobenzene group, and each of the first functional group 110 and the second functional group 120 may include an ethylene glycol (—OCH$_2$CH$_2$O—) monomer.

The second element solvent molecule 102' is structured to have a smaller intermolecular attraction than the first element solvent molecule 101' and thus has a low viscosity, thereby increasing the dielectrophoretic reactivity of the dispersed light emitting elements 30. In addition, the second element solvent molecule 102' can be easily removed by volatilization at a relatively low temperature in a subsequent process.

In an embodiment, the device solvent molecule 100' may be any one of compounds represented by Chemical Formulae 7 through 11 below:

Chemical Formula 7

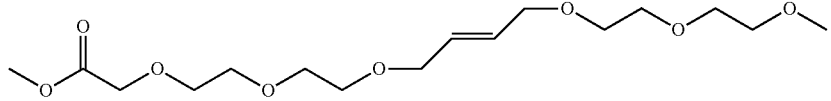

Chemical Formula 8

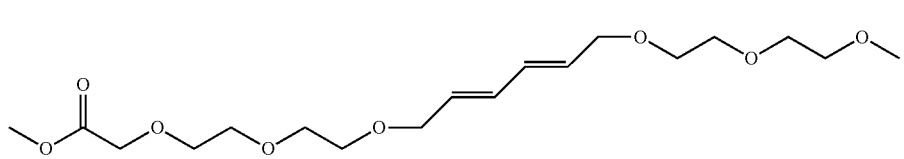

Chemical Formula 9

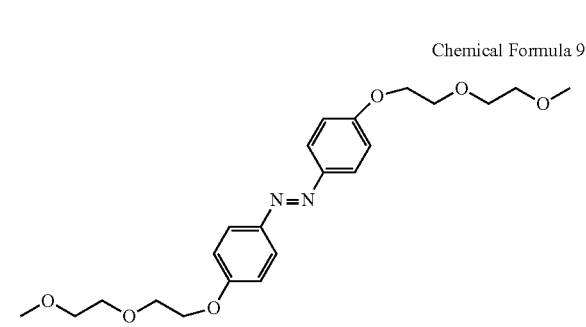

Chemical Formula 11

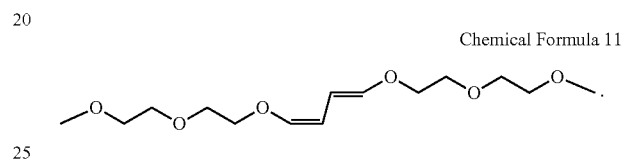

For example, when the device solvent molecule 100' is a compound represented by Chemical Formula 9, the third functional group 150 may be an azobenzene group, and the first and second functional groups 110 and 120 may have 2 as the n value and a methyl (—CH3) group as $R_3$ in Chemical Formula 1. The compound represented by Chemical Formula 9 may have a viscosity of 9 to 11 cp. Thus, the light emitting elements 30 can be kept dispersed. In addition, by having a viscosity within the above range, the device ink 1000 can be sprayed on the electrodes 21 and 22 through a nozzle of an inkjet printing device.

Chemical Formula 10

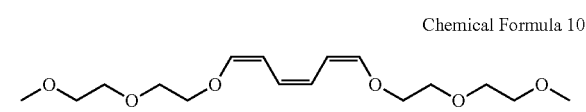

When the device solvent molecule 100' is a compound represented by Chemical Formula 9, the third functional group 150 may be isomerized through a reaction in Chemical Reaction Formula 8 below:

Chemical Reaction Formula 8

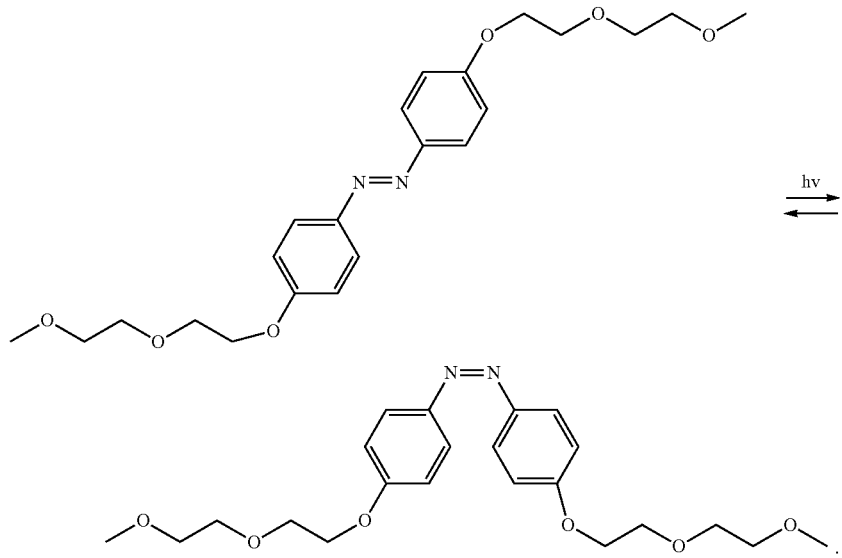

Referring to Chemical Reaction Formula 8, in the compound represented by Chemical Formula 9, a trans-azobenzene group may be isomerized to a cis-azobenzene group by irradiation of light (hv). For example, the device solvent molecule 100' may include the first element solvent molecule 101' represented by Chemical Formula 9, and the first element solvent molecule 101' may be isomerized to the second element solvent molecule 102'.

The first element solvent molecule 101' represented by Chemical Formula 9 is structured to have a relatively large intermolecular attraction. Because the second element solvent molecule 102' formed through an isomerization reaction of an azobenzene group has a small intermolecular attraction and a relatively low viscosity and boiling point, the dielectrophoretic reactivity of the light emitting elements 30 can be increased, and the second element solvent 102 can be easily removed in a subsequent process.

In an embodiment, in the element solvent 100, the first element solvent 101 having the first isomer (151) structure may have a viscosity of 7 to 15 cp, and the second element solvent 102 having the second isomer (152) structure may have a viscosity of 5 cp or less.

As the first element solvent 101 has a viscosity of a certain level or higher, it can keep the light emitting elements 30 having a large specific gravity dispersed for a certain period of time. When the viscosity of the first element solvent molecule 101' is 7 cp or less, the light emitting elements 30 cannot be kept dispersed after the device ink 1000 is made. Thus, the device ink 1000 may be sprayed with non-uniform dispersion through a nozzle of an inkjet printing device. In addition, when the viscosity of the first element solvent molecule 101' has a large value of 15 cp or more, the second element solvent molecule 102' may also have a high viscosity, thus reducing the dielectrophoretic reactivity of the light emitting elements 30. On the other hand, the first element solvent molecule 101' according to the embodiment may have viscosity within the above range, and the second element solvent molecule 102' formed by an isomerization reaction of the third functional group 150 may have a low molecular weight and viscosity.

A method for manufacturing a display device 1 according to an embodiment will now be described.

Figure 8:
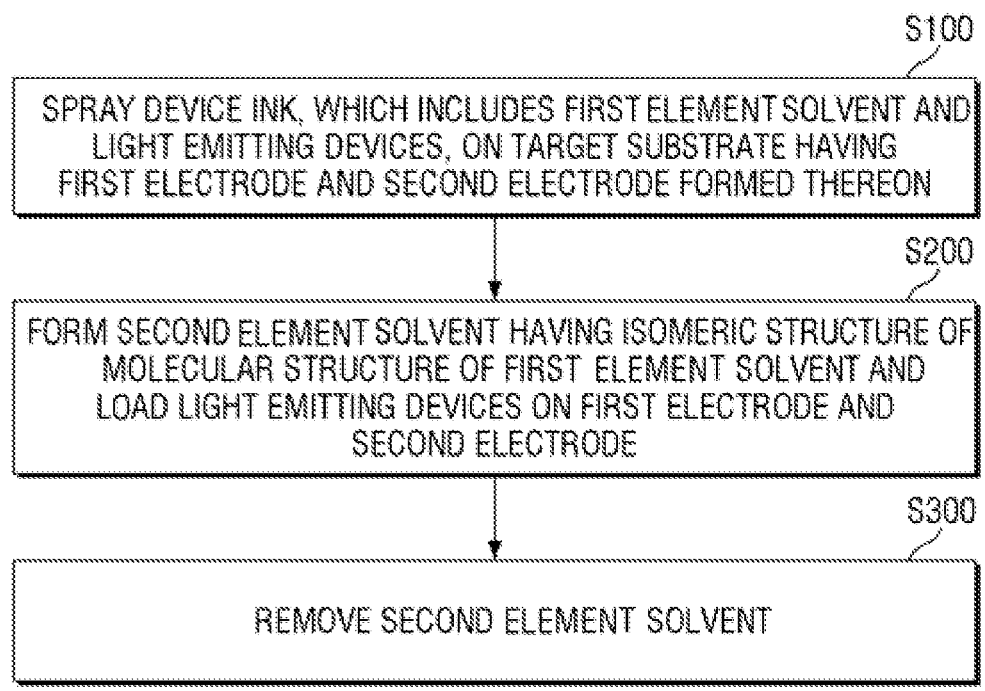
FIG. 8 is a flowchart illustrating a method for manufacturing a display device according to an embodiment.

FIG. 8 is a flowchart illustrating a method for manufacturing a display device according to an embodiment.

Referring to FIG. 8, the method for manufacturing the display device 1 according to the embodiment may include spraying a device ink 1000, which includes a first element solvent 101 and light emitting elements 30 dispersed in the first element solvent 101, on a target substrate SUB having a first electrode 21 and a second electrode 22 formed thereon (operation S100), forming a second element solvent 102 having an isomeric structure of a molecular structure of the first element solvent 101 and loading the light emitting elements 30 on the first electrode 21 and the second electrode 22 (operation S200), and removing the second element solvent 102.

As described above, the display device 1 may be manufactured by spraying the device ink 1000 using an inkjet printing device and placing the light emitting elements 30 on the electrodes 21 and 22. Here, the element solvent 100 may include the first element solvent 101 having a viscosity that can keep the light emitting elements 30 dispersed. However, in order to improve the degree of alignment of the light emitting elements 30 in the loading of the light emitting elements 30 (operation S200), the method for manufacturing the display device 1 according to the embodiment may include forming the second element solvent 102 by irradiating light and/or heat to the first element solvent 101. The formation of the second element solvent 102 having a lower viscosity than the first element solvent 101 may improve the dielectrophoretic reactivity of the light emitting elements 30 and minimize or reduce a change in the alignment state of the light emitting elements 30 that may occur during the removal of the second element solvent 102.

The method for manufacturing the display device according to the embodiment will now be described in further detail with reference to FIGS. 9 through 21.

Figure 9:
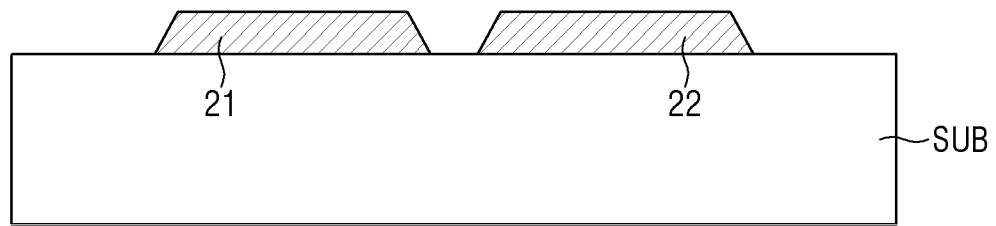
FIGS. 9 and 10 are cross-sectional views illustrating one or more acts of the method for manufacturing the display device according to the embodiment.
Figure 9:
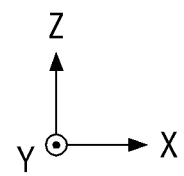
Figure 10:
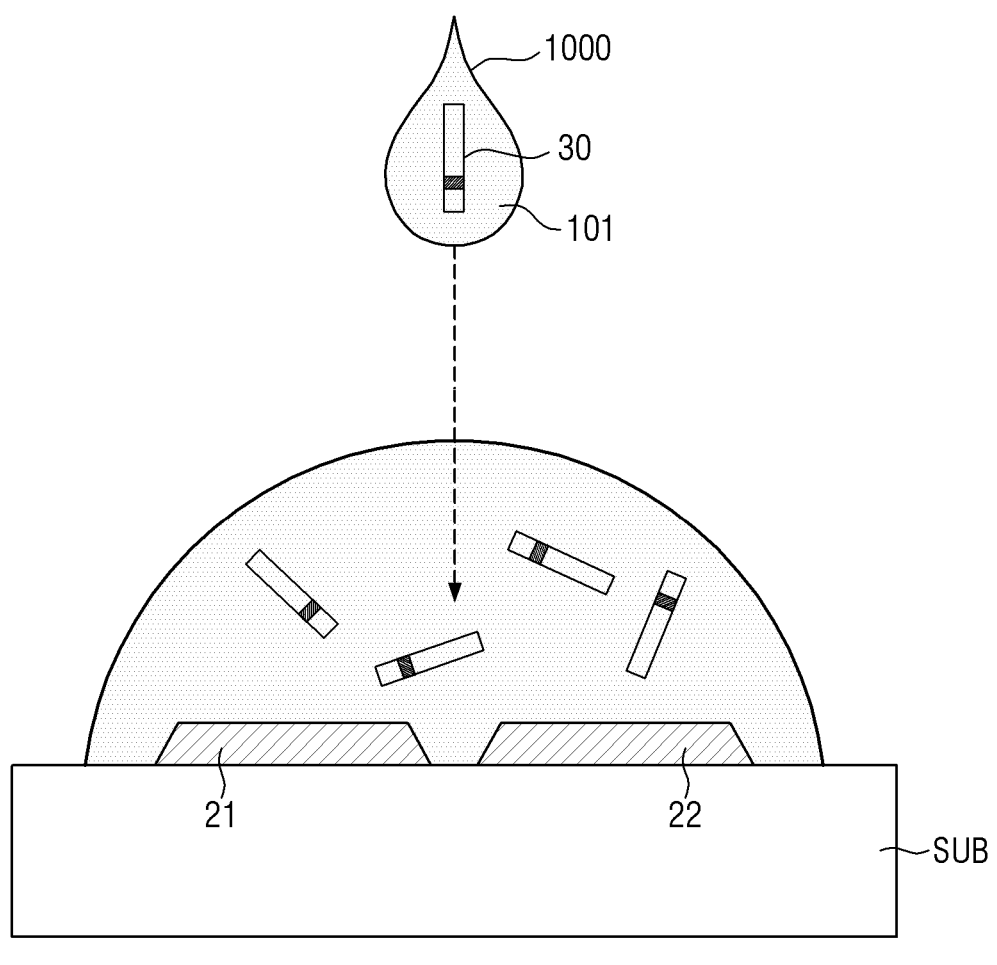

FIGS. 9 and 10 are cross-sectional views illustrating a part (e.g., one or more acts) of the method for manufacturing the display device according to the embodiment.

First, referring to FIG. 9, a target substrate SUB on which a first electrode 21 and a second electrode 22 are formed is prepared (operation S100). In the following drawings, only the electrodes 21 and 22 and light emitting elements 30 on the target substrate SUB are illustrated for ease of description. However, the display device 1 is not limited thereto and may include more members such as barriers 40 and contact electrodes 26 as described above.

Next, referring to FIG. 10, a device ink 1000 including the light emitting elements 30 is sprayed on the first electrode 21 and the second electrode 22. The device ink 1000 may include an element solvent 100, and the light emitting elements 30 may be dispersed in the element solvent 100. In an embodiment, the device ink 1000 may be provided in a solution or colloid state. The element solvent 100 of the device ink 1000 sprayed on the electrodes 21 and 22 may be a first element solvent 101 including a third functional group 150 of a first isomer 151 as described above. The first element solvent 101 may have a relatively high viscosity and may be sprayed on the electrodes 21 and 22 while the light emitting elements 30 are kept dispersed.

Next, the light emitting elements 30 are loaded between the first electrode 21 and the second electrode 22 (operation S200). The loading of the light emitting elements 30 (operation S200) may include forming an electric field E in the device ink 1000 by transmitting an electrical signal to the first electrode 21 and the second electrode 22 and letting the light emitting elements 30 be placed on the electrodes 21 and 22 by a dielectrophoretic force F applied by the electric field.

In the present specification, the 'loading' of the light emitting elements 30 may be understood as positioning the light emitting elements 30 on the electrodes 21 and 22 such that at least a part of each light emitting element 30 directly contacts the electrodes 21 and 22 or placing the light emitting elements 30 on another member such that the light emitting elements 30 overlap the electrodes 21 and 22 with the member interposed between them. For example, the light emitting elements 30 'loaded' on the electrodes 21 and 22 may be construed as being positioned or landed on the electrodes 21 and 22 such that at least a part, if not all, of each light emitting element 30 contacts or overlaps the electrodes 21 and 22.

In one or more embodiments, when alternating current (AC) power is applied to the electrodes 21 and 22, the electric field E may be formed in the device ink 1000 sprayed on the electrodes 21 and 22. The electric field E may apply a dielectrophoretic force to the light emitting elements 30, and the light emitting elements 30 to which the dielectrophoretic force has been applied may be placed on the first electrode 21 and the second electrode 22.

However, because a first element solvent 101 includes first element solvent molecules 101', each having the first isomer 151, its viscosity has a large value. The light emitting elements 30 may be subjected to a weak dielectrophoretic force F1 in the first element solvent 101 having a high viscosity and may be placed on the electrodes 21 and 22 with a non-uniform degree of alignment.

Figure 11:
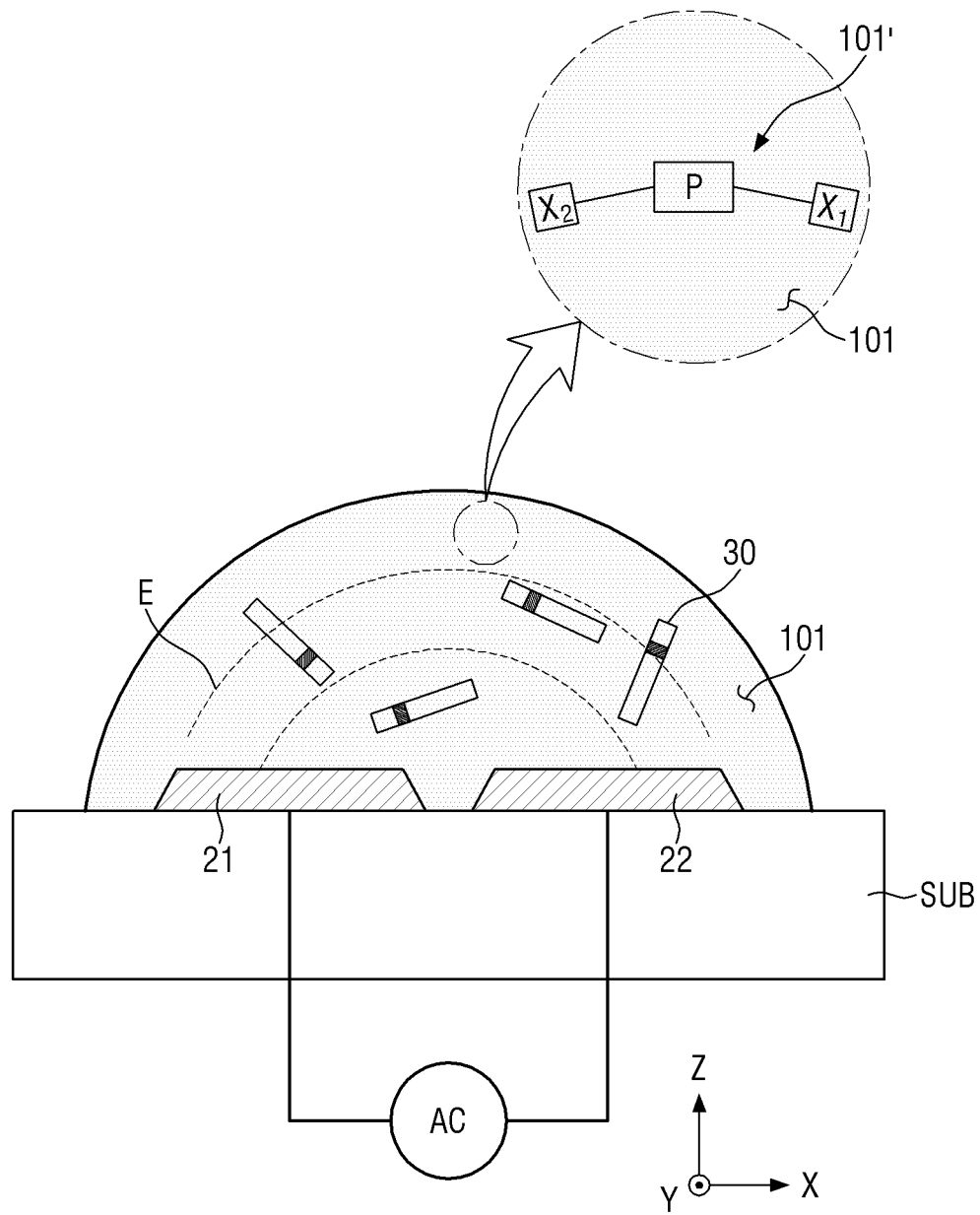
FIGS. 11 through 13 are schematic views illustrating a process in which light emitting elements dispersed in an element solvent are placed on electrodes according to a comparative example.
Figure 12:
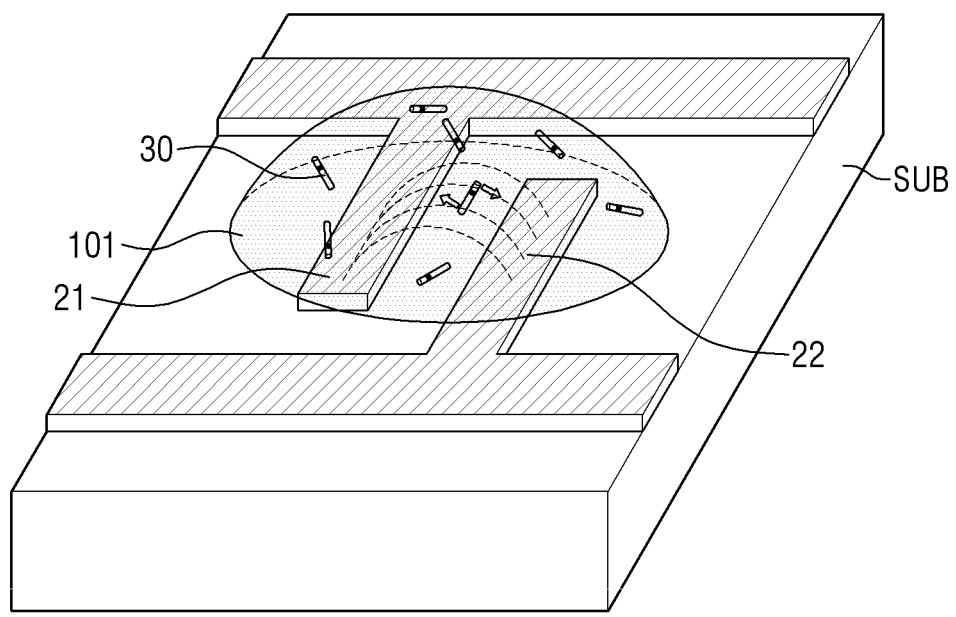
Figure 12:
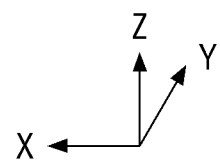
Figure 13:
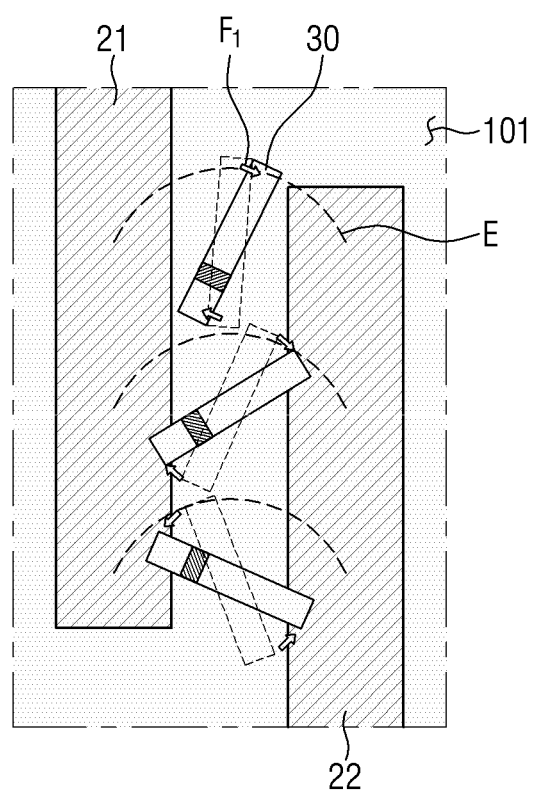

FIGS. 11 through 13 are schematic views illustrating a process in which light emitting elements dispersed in a device solvent are placed on electrodes according to a comparative example.

Referring to FIGS. 11 and 12, the first element solvent 101 and the light emitting elements 30 are sprayed on the electrodes 21 and 22, and the electric field E is formed by applying AC power through the electrodes 21 and 22. The light emitting elements 30 may receive the dielectrophoretic force F1 applied by the electric field E and move from their initially dispersed positions (indicated by dotted lines in FIG. 12) toward the electrodes 21 and 22. However, the light emitting elements 30 may experience the resistance of the first element solvent 101 having a high viscosity, and thus a relatively weak dielectrophoretic force F1 may be applied to the light emitting elements 30.

Referring to FIG. 13, the electric field E may be formed on the first element solvent 101 by the AC power applied to the first electrode 21 and the second electrode 22. The dielectrophoretic force F1 due to the electric field E may be applied to the light emitting elements 30, thereby orienting the light emitting elements 30 toward the electrodes 21 and 22. As described above, the first element solvent 101 may have a high viscosity. Due to the resistance of the first element solvent 101 having a high viscosity, a weak dielectrophoretic force F1 is applied to the light emitting elements 30.

As illustrated in the drawing, some light emitting elements 30 may not be on the electrodes 21 and 22. In addition, even if both ends of the light emitting elements 30 are on the electrodes 21 and 22, an acute angle formed by a direction in which each light emitting element 30 extends and the electrodes 21 and 22 may not be constant. The dielectrophoretic force F1 applied by the electric field E may not have a sufficient intensity to cause the light emitting elements 30 dispersed in the first element solvent 101 having a high viscosity to be oriented with a uniform (e.g., substantially uniform) degree of alignment.

In addition, when the first element solvent 101 is directly removed by volatilization in a subsequent process, the orientation or alignment state of the light emitting elements 30 may be changed by the first element solvent 101 having a high viscosity, or the first element solvent 101 may not be completely removed.

Figure 14:
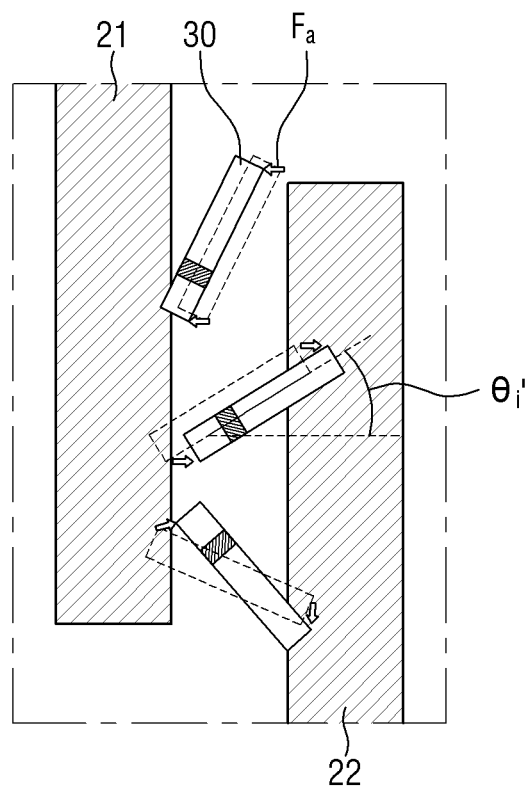
FIG. 14 is a plan view illustrating a state in which the element solvent has been removed according to the comparative example.
Figure 15:
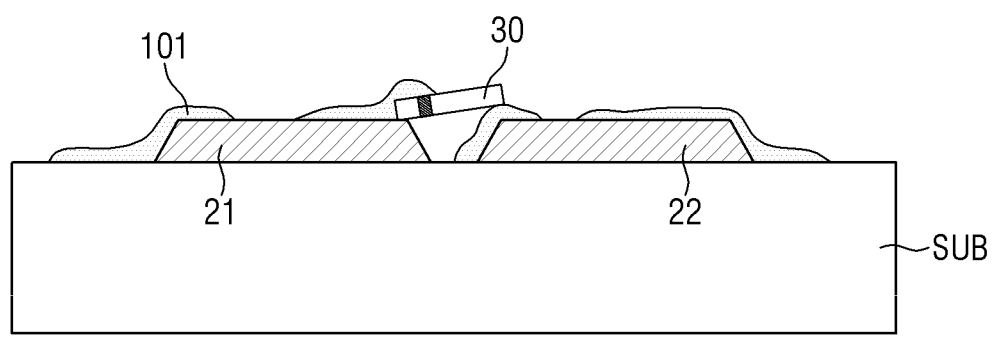
FIG. 15 is a cross-sectional view illustrating the state in which the element solvent has been removed according to the comparative example.

FIG. 14 is a plan view illustrating a state in which the device solvent has been removed according to a comparative example. FIG. 15 is a cross-sectional view illustrating the state in which the device solvent has been removed according to the comparative example.

Referring to FIG. 14, as the first element solvent 101 is removed, a hydrodynamic force Fa may be applied in a direction to the light emitting elements 30 in the first element solvent 101 loaded on the electrodes 21 and 22. The first element solvent 101 having a high viscosity may apply a strong hydrodynamic force Fa to the light emitting elements 30 as it is removed by volatilization, and the alignment state of the light emitting elements 30 may change as the light emitting elements 30 move from their initial alignment positions (indicated by dotted lines in FIG. 14). Accordingly, an acute angle Θi' formed by the direction in which the light emitting elements 30 finally loaded on the electrodes 21 and 22 extend and a direction perpendicular (e.g., substantially perpendicular) to the direction in which the electrodes 21 and 22 extend may have a large value. The acute angle Θi' may be 20 degrees or more. Accordingly, an acute angle formed by the direction in which the light emitting elements 30 extend and the direction in which the electrodes 21 and 22 extend may be 80 degrees or less.

Referring to FIG. 15, the first element solvent 101 includes the first element solvent molecules 101' having a large molecular weight. Therefore, some residues may remain even if a process of removing the first element solvent 101 by volatilization is performed. The residues may become impurities in the display device 1 and cause a contact failure between the light emitting elements 30 and the electrodes 21 and 22.

On the other hand, the method for manufacturing the display device 1 according to the embodiments includes forming a second element solvent 102 by irradiating light UV and/or heat H to the first element solvent 101 before the loading of the light emitting elements 30 (operation S200). When the light UV and/or the heat H is irradiated to the first element solvent 101, the first isomer 151 of the third functional group 150 forms a second isomer 152 through an isomerization reaction. The first element solvent molecules 101' may form second element solvent molecules 102', and the second element solvent molecules 102' may form the second element solvent 102 having a lower viscosity and boiling point than the first element solvent 101. The light emitting elements 30 may be dispersed in the second element solvent 102 having a low viscosity, and their orientation directions may be aligned on the electrodes 21 and 22 by a strong dielectrophoretic force F2 applied by the electric field E. In addition, the second element solvent 102 having a low viscosity and boiling point may be easily removed in a subsequent treatment process and may minimize or reduce a change in the alignment state of the light emitting elements 30.

Figure 16:
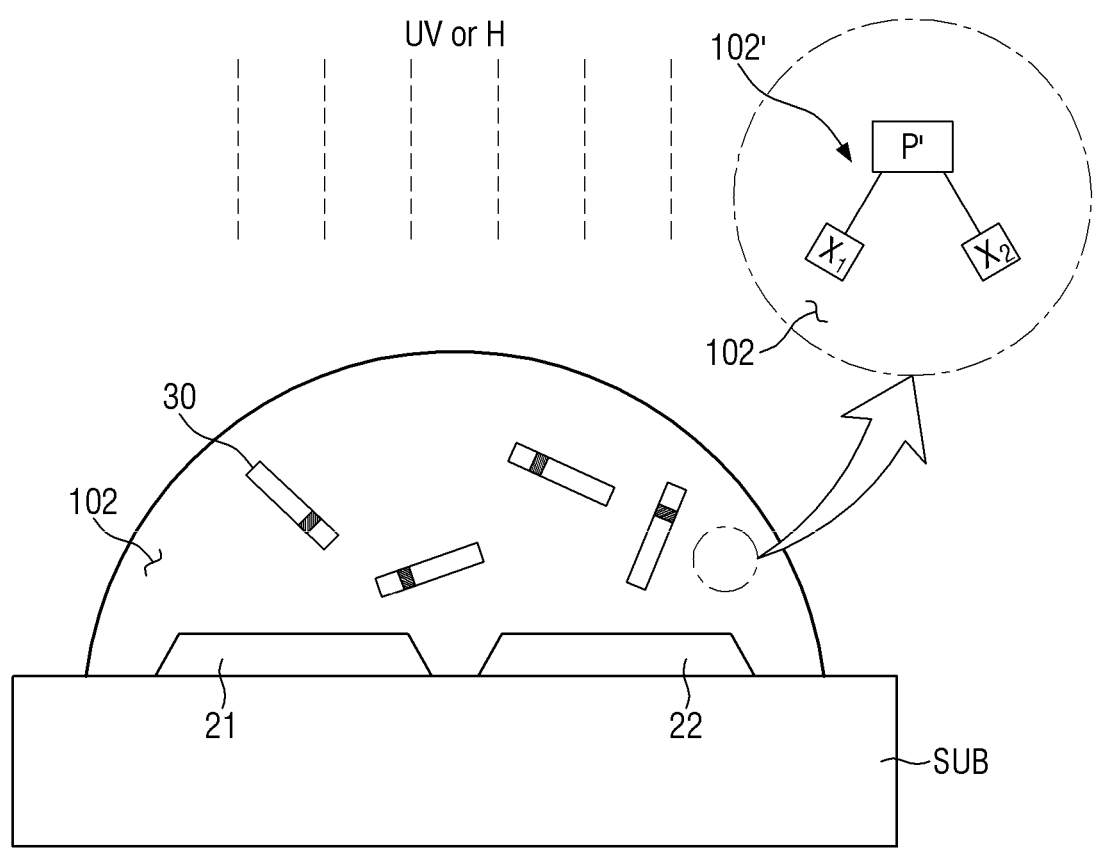
FIG. 16 is a schematic view illustrating an operation of forming a second element solvent according to an embodiment.

FIG. 16 is a schematic view illustrating an operation of forming a second element solvent according to an embodiment.

Referring to FIG. 16, the second element solvent 102 is formed by irradiating light UV and/or heat H to the first element solvent 101. The first element solvent 101 may include the third functional group 150 of the first isomer 151 and may be isomerized by the irradiated light UV and/or heat H to form the third functional group 150 of the second isomer 152. For example, the first element solvent molecules 101' may form the second element solvent molecules 102' having a small intermolecular attraction. Accordingly, the light emitting elements 30 may be dispersed in the second element solvent 102 having a relatively low viscosity, and a strong dielectrophoretic force F2 may be applied to the light emitting elements 30 by the electric field E because the resistance of the solvent is reduced.

However, the forming of the second element solvent 102 is not necessarily performed after the first element solvent 101 is sprayed on the electrodes 21 and 22. For example, some first element solvent 101 located in a nozzle may be converted into the second element solvent 102 by irradiating the light UV and/or the heat H toward the nozzle just before the first element solvent 101 is sprayed from the nozzle. In one or more embodiments, the second element solvent 102 may be formed by irradiating light or heat while the first element solvent 101 is being ejected from the nozzle and dropped and sprayed on the electrodes 21 and 22 or by irradiating the light UV and/or the heat at the same time as the electric field E is formed on the electrodes 21 and 22. However, the present disclosure is not limited thereto.

Figure 17:
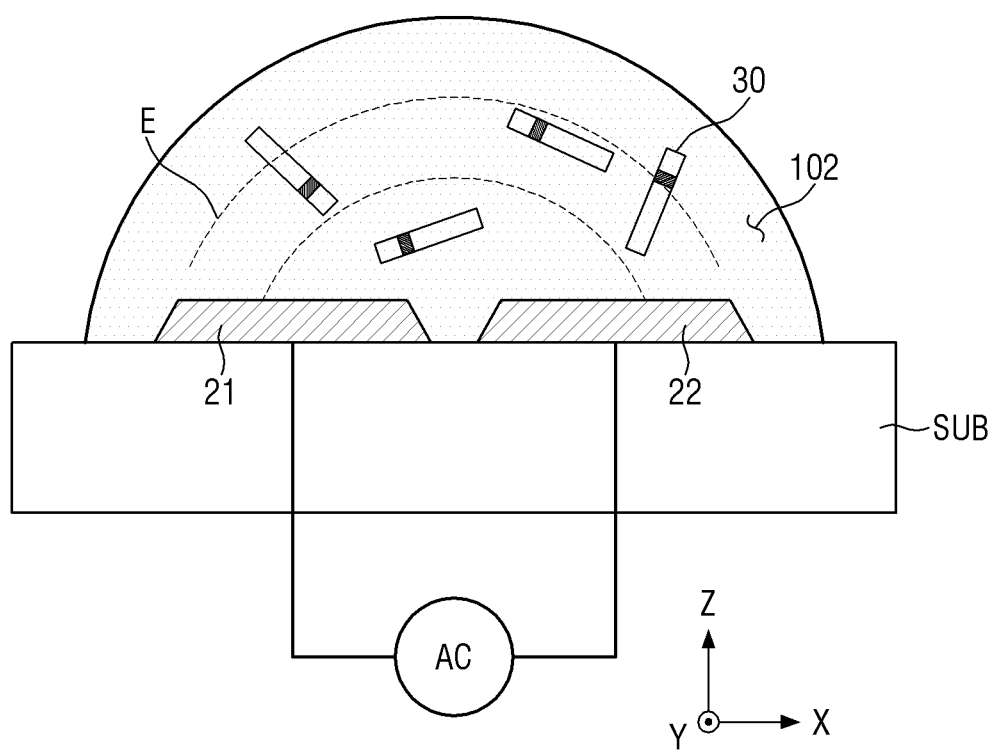
FIGS. 17 through 19 are schematic views illustrating a process in which light emitting elements dispersed in an element solvent are placed on electrodes according to an embodiment.
Figure 18:
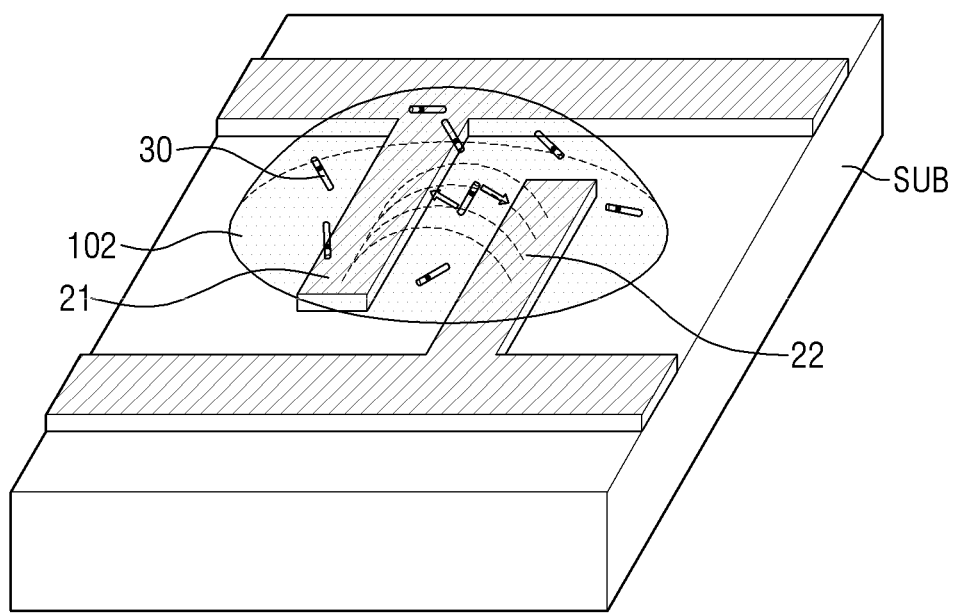
Figure 18:
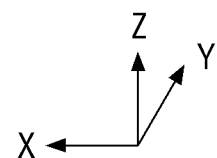
Figure 19:
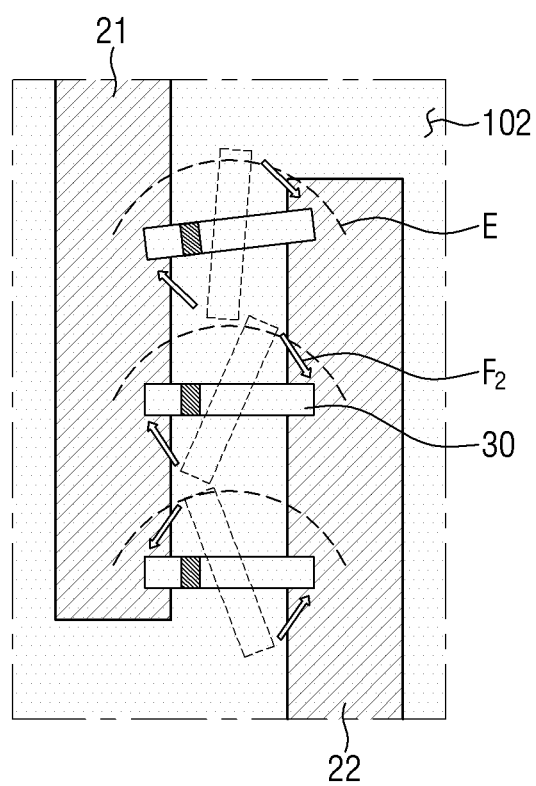

FIGS. 17 through 19 are schematic views illustrating a process in which light emitting elements dispersed in a device solvent are placed on electrodes according to an embodiment.

Referring to FIGS. 17 through 19, because the second element solvent 102 has a low viscosity, the dielectrophoretic force F2 applied to the light emitting elements 30 by the electric field E may have a strong intensity. The light emitting elements 30 may have both ends moved from their initially sprayed positions (indicated by dotted lines in FIG. 19) toward the electrodes 21 and 22 and may be oriented with a relatively uniform degree of alignment. As illustrated in the drawings, both ends of most of the light emitting elements 30 may be on the electrodes 21 and 22. In one or more embodiments, the acute angle formed by the direction in which the light emitting elements 30 extend and the electrodes 21 and 22 may be constant. The method for manufacturing the display device 1 according to the embodiment may include forming the second element solvent 102 by irradiating light UV to the first element solvent 101, and the light emitting elements 30 may be aligned in the second element solvent 102 having a low viscosity. For example, the display device 1 having the improved dielectrophoretic reactivity and improved degree of alignment of the light emitting elements 30 can be manufactured.

Finally, when the light emitting elements 30 have been aligned on the electrodes 21 and 22, the element solvent 100, for example, the second element solvent 102, is removed.

Figure 20:
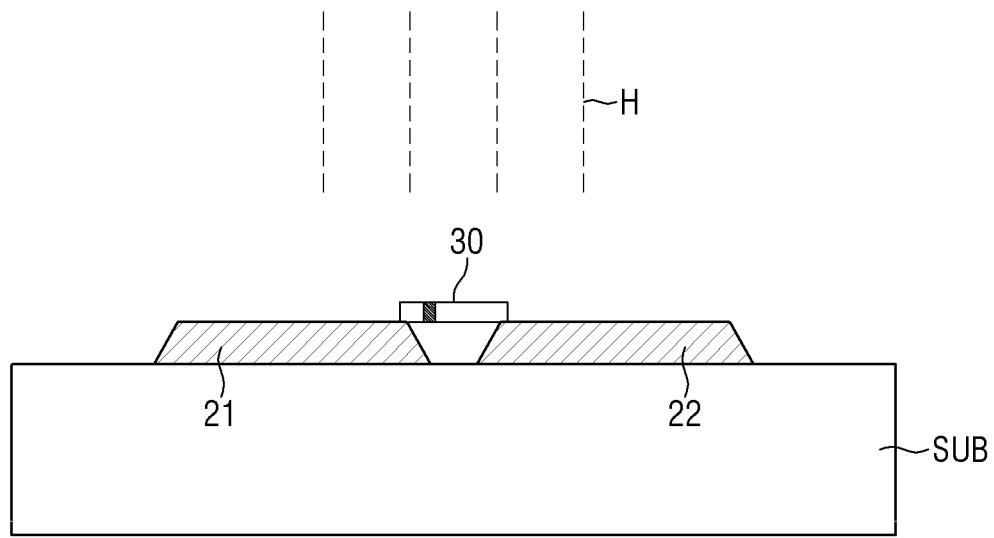
FIG. 20 is a cross-sectional view illustrating an operation of removing the second element solvent according to an embodiment.
Figure 21:
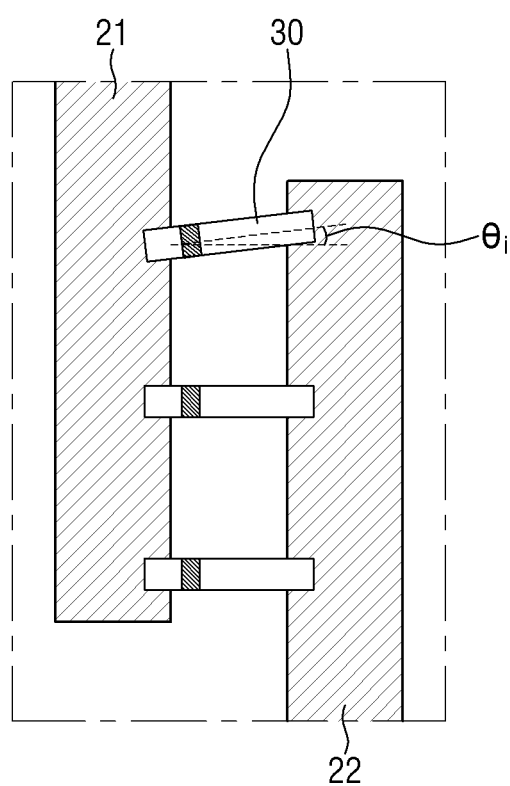
FIG. 21 is a plan view illustrating the alignment of the light emitting elements according to an embodiment.

FIG. 20 is a cross-sectional view illustrating an operation of removing the second element solvent according to an embodiment. FIG. 21 is a plan view illustrating the alignment of the light emitting elements according to an embodiment.

Referring to FIGS. 20 and 21, the element solvent 100 may be removed by performing any suitable method generally used in the art. The second element solvent 102 may have a low boiling point by including a compound having a smaller intermolecular attraction than the first element solvent 101 and may be removed by volatilization at a relatively low temperature. For example, the second element solvent 102 may be removed through a method such as heat treatment and/or infrared irradiation.

The light emitting elements 30 in the second element solvent 102 having a low viscosity may be subjected to a strong dielectrophoretic force F2 and thus may be oriented with a relatively uniform degree of alignment. In addition, even if removed by volatilization, the second element solvent 102 may apply a weak hydrodynamic force to the aligned light emitting elements 30. Accordingly, the acute angle Θi formed by the direction in which the light emitting elements 30 finally loaded on the electrodes 21 and 22 extend and the direction perpendicular (e.g., substantially perpendicular) to the direction in which the electrodes 21 and 22 extend may have a very small value. The acute angle Θi may be 5 degrees or more. Accordingly, the acute angle formed by the direction in which the light emitting elements 30 extend and the direction in which the electrodes 21 and 22 extend may be 85 degrees or more. For example, the acute angle formed by the direction in which the light emitting elements 30 extend and the direction in which the electrodes 21 and 22 extend may be 88 to 90 degrees. However, the present disclosure is not limited thereto.

Through the above process, the display device 1 including the light emitting elements 30 may be manufactured. However, the method for manufacturing the display device 1 is not limited thereto. Because the display device 1 includes more members as described above, more processes may be performed, but a detailed description thereof will be omitted.

Figure 22:
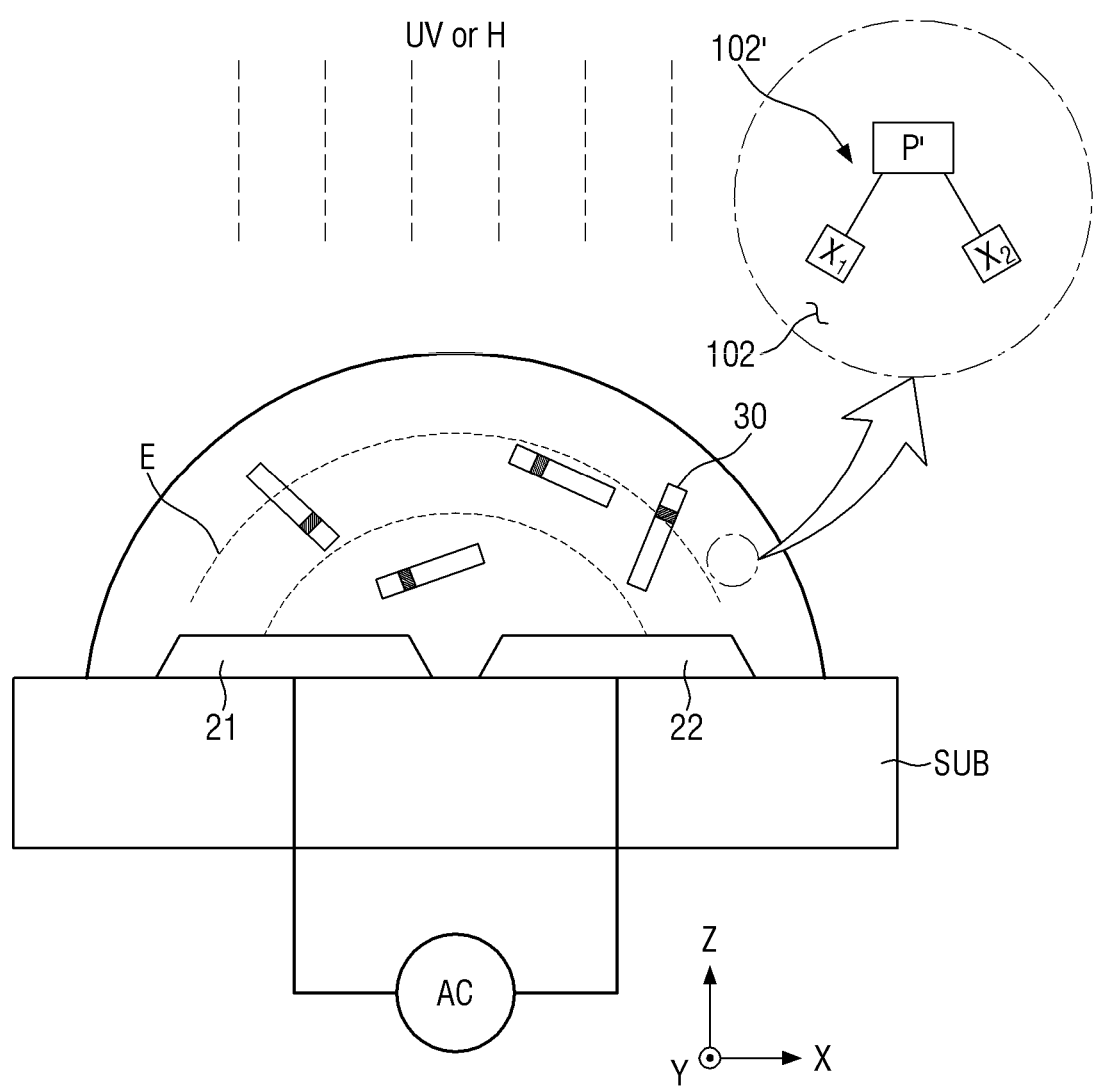
FIG. 22 is a plan view illustrating one or more acts of a method for manufacturing a display device according to another embodiment.

FIG. 22 is a plan view illustrating a part (e.g., one or more acts) of a method for manufacturing a display device according to another embodiment.

As described above, in an operation of loading light emitting elements 30 on electrodes 21 and 22, an operation of forming a second element solvent 102 by irradiating light UV or heat H to a first element solvent 101 and an operation of applying a dielectrophoretic force F to the light emitting elements 30 by forming an electric field E may be concurrently (e.g., simultaneously) performed in one process.

Referring to FIG. 22, AC power may be applied through the electrodes 21 and 22 while the light UV and/or the heat H is being irradiated to the first element solvent 101 sprayed on the electrodes 21 and 22. Accordingly, the first element solvent 101 may form the second element solvent 102, and at the same time (e.g., concurrently), the light emitting elements 30 may be subjected to a dielectrophoretic force by an electric field EL formed by the AC power. The operation of loading the light emitting elements 30 on the electrodes 21 and 22 by forming the electric field E in the second element solvent 102 may have a relatively short process time. For example, because the process of loading the light emitting elements 30 is performed substantially during the process of irradiating the light UV or the heat H to the first element solvent 101, the overall process time can be shortened.

In addition, although not illustrated in the drawing, after the light emitting elements 30 are loaded, a process of volatilizing the second element solvent 102 of FIG. 20 may be performed. In one or more embodiments, when the first element solvent 101 is formed into the second element solvent 102 by irradiating the heat H in the operation of forming the second element solvent 102, the light emitting elements 30 may be loaded on the electrodes 21 and 22 by applying AC power to the electrodes 21 and 22 in one heat treatment process. Accordingly, the efficiency of the process of manufacturing the display device 1 can be improved.

In concluding the detailed description, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation.

The invention claimed is:

1. A method for manufacturing a display device, the method comprising:
   spraying a device ink, which comprises a first element solvent and light emitting elements dispersed in the first element solvent, on a target substrate having a first electrode and a second electrode formed thereon;
   forming a second element solvent having an isomeric structure of a molecular structure of the first element solvent, and loading the light emitting elements on the first electrode and the second electrode; and
   removing the second element solvent.

2. The method of claim 1, wherein the first element solvent comprises:
   a first functional group and a second functional group, each independently represented by Chemical Formula 1 below; and
   a third functional group comprising at least one double bond and configured to undergo an isomerization reaction, the third functional group being bonded to the first functional group and the second functional group:

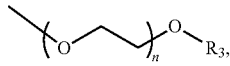

Chemical Formula 1 wherein n is an integer of 1 to 5, and $R_3$ is any one of a $C_1$-$C_5$ alkyl group, a $C_2$-$C_5$ alkenyl group, a $C_2$-$C_5$ alkynyl group, a $C_1$-$C_5$ alkyl ether group, a $C_2$-$C_5$ alkenyl ether group, and a $C_2$-$C_5$ alkyl ester group.

3. The method of claim 2, wherein the first element solvent forms the second element solvent as the double bond of the third functional group undergoes a cis-trans isomerization reaction in response to irradiated light.

4. The method of claim 3, wherein the first element solvent comprises at least any one of compounds represented by Chemical Formulae 2 through 4 below:

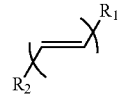

Chemical Formula 2

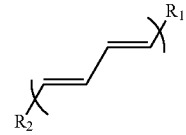

Chemical Formula 3

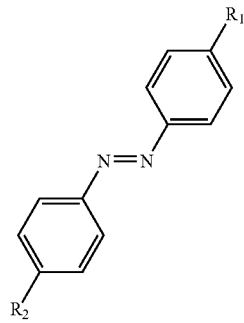

Chemical Formula 4 wherein $R_1$ and $R_2$ are represented by Chemical Formula 1, and the sum of an n value (n1) of $R_1$ and an n value (n2) of $R_2$ represented by Chemical Formula 1 is in a range of 2 to 6.

5. The method of claim 4, wherein the first element solvent comprises at least any one of compounds represented by Chemical Formulae 7 through 9 below:

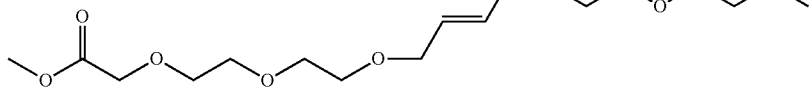

Chemical Formula 7

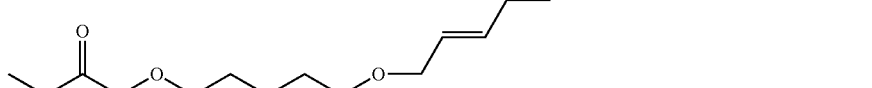

Chemical Formula 8

Chemical Formula 9

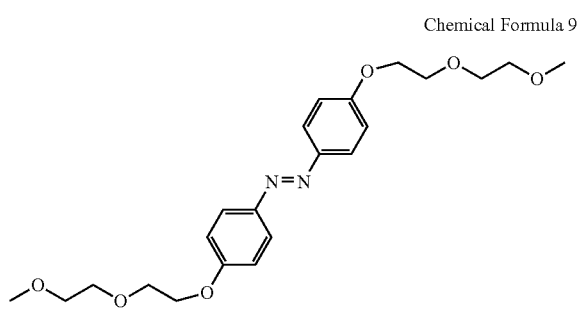

6. The method of claim 2, wherein the first element solvent forms the second element solvent as the double bond of the third functional group undergoes a pericyclic reaction.

7. The method of claim 6, wherein the first element solvent comprises at least any one of compounds represented by Chemical Formulae 5 and 6 below:

Chemical Formula 5

Chemical Formula 6

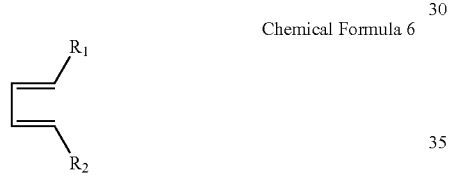

wherein $R_1$ and $R_2$ are represented by Chemical Formula 1, and the sum of an n value (n1) of $R_1$ and an n value (n2) of $R_2$ represented by Chemical Formula 1 is in the range of 2 to 6.

8. The method of claim 2, wherein in the loading of the light emitting elements, a viscosity of the second element solvent has a smaller value than a viscosity of the first element solvent.

9. The method of claim 8, wherein the first element solvent has a viscosity of about 7 to about 15 cp, and
the second element solvent has a viscosity of about 5 cp or less.

10. The method of claim 1, wherein the loading of the light emitting elements comprises:
forming an electric field on the second element solvent; and
aligning orientation directions of the light emitting elements by the electric field.

11. The method of claim 10, wherein the light emitting elements extend in one direction, and
an acute angle formed by the one direction in which the light emitting elements extend and a direction in which the first electrode and second electrode extend is in the range of about 88 to about 90 degrees.

12. A light emitting element solvent in which light emitting elements comprising semiconductor crystals are dispersed, the light emitting element solvent comprising:
a first functional group and a second functional group which are each independently represented by Chemical Formula 1 below; and
a third functional group which comprises at least one double bond and is configured to undergo an isomerization reaction, the third functional group being bonded to the first functional group and the second functional group and the light emitting element solvent comprises at least any one of compounds represented by Chemical Formulae 2 through 6:

Chemical Formula 1

wherein n is an integer of 1 to 5, and $R_3$ is any one of a $C_1$-$C_5$ alkyl group, a $C_2$-$C_5$ alkenyl group, a $C_2$-$C_5$ alkynyl group, a $C_1$-$C_5$ alkyl ether group, a $C_2$-$C_5$ alkenyl ether group, and a $C_2$-$C_5$ alkyl ester group, Chemical Formula 2

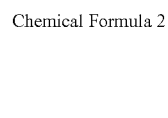

Chemical Formula 3

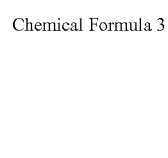

Chemical Formula 4

Chemical Formula 5

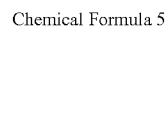

Chemical Formula 6

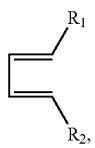

and
wherein $R_1$ and $R_2$ are represented by Chemical Formula 1, and the sum of an n value (n1) of $R_1$ and an n value (n2) of $R_2$ represented by Chemical Formula 1 is in a range of 2 to 6.

13. The light emitting element solvent of claim 12, wherein a first element solvent which comprises the third functional group forms a second element solvent having a low viscosity as the third functional group undergoes an isomerization reaction.

14. The light emitting element solvent of claim 13, comprising at least any one of compounds represented by Chemical Formulae 7 through 11 below:

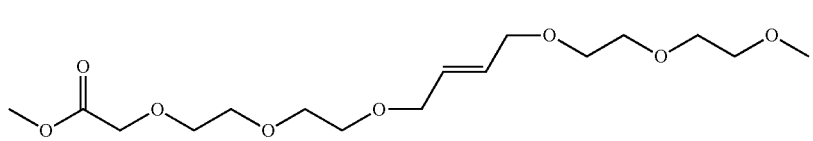

Chemical Formula 7

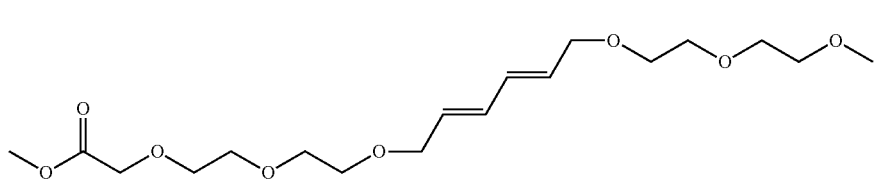

Chemical Formula 8

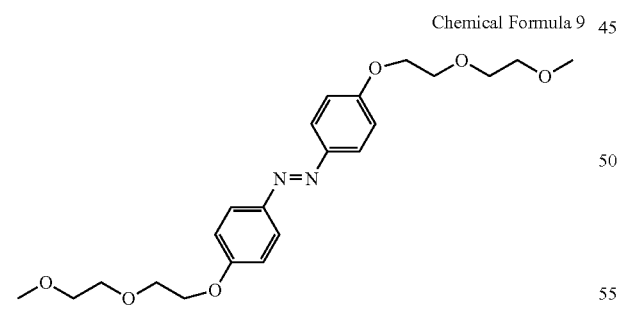

Chemical Formula 9

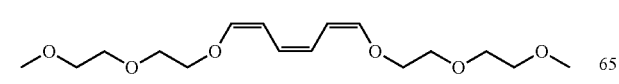

Chemical Formula 10

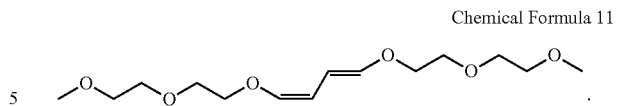

Chemical Formula 11

15. The light emitting element solvent of claim 14, comprising at least any one of compounds represented by Chemical Formulae 7 through 9,
wherein the third functional group forms the second element solvent through a cis-trans isomerization reaction.

16. The light emitting element solvent of claim 14, comprising at least any one of compounds represented by Chemical Formulae 10 and 11,
wherein the third functional group forms the second element solvent through a pericyclic reaction.

17. A light emitting element ink comprising:
a light emitting element which comprises a semiconductor crystal and an insulating film around an outer peripheral surface of the semiconductor crystal; and
a light emitting element solvent in which one or more light emitting elements are dispersed,
wherein the light emitting element solvent comprises a first functional group and a second functional group, each independently represented by Chemical Formula 1 below, and a third functional group comprising at least one double bond and configured to undergo an isomerization reaction, the third functional group being bonded to the first functional group and the second functional group,
wherein the light emitting element solvent comprises at least any one of compounds represented by Chemical Formulae 2 through 6:

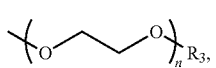

Chemical Formula 1 wherein n is an integer of 1 to 5, and $R_3$ is any one of a $C_1$-$C_5$ alkyl group, a $C_2$-$C_5$ alkenyl group, a $C_2$-$C_5$ alkynyl group, a $C_1$-$C_5$ alkyl ether group, a $C_2$-$C_5$ alkenyl ether group, and a $C_2$-$C_5$ alkyl ester group, Chemical Formula 2

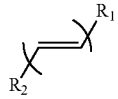

Chemical Formula 3

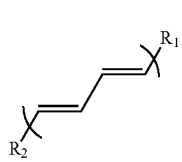

Chemical Formula 4

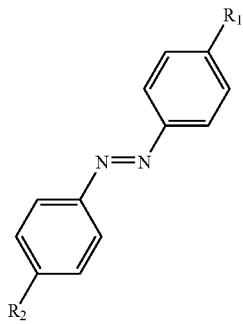

Chemical Formula 5

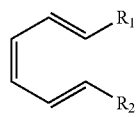

Chemical Formula 6 and wherein $R_1$ and $R_2$ are represented by Chemical Formula 1, and the sum of an n value (n1) of $R_1$ and an n value (n2) of $R_2$ represented by Chemical Formula 1 is in a range of 2 to 6.

18. The light emitting element ink of claim 17, wherein the light emitting element solvent comprises at least any one of compounds represented by Chemical Formulae 7 through 11 below:

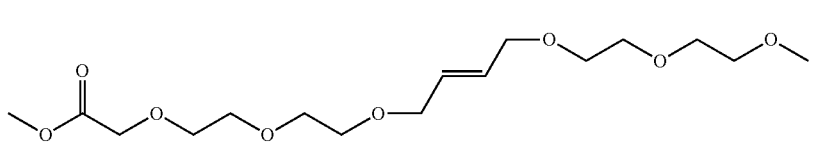

Chemical Formula 7

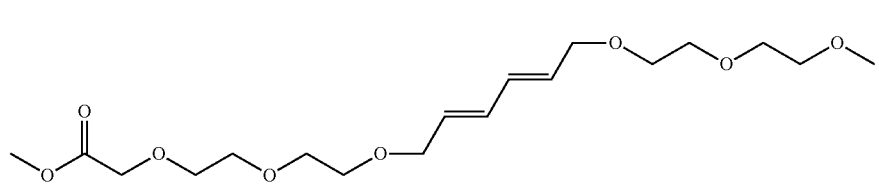

Chemical Formula 8

Chemical Formula 9

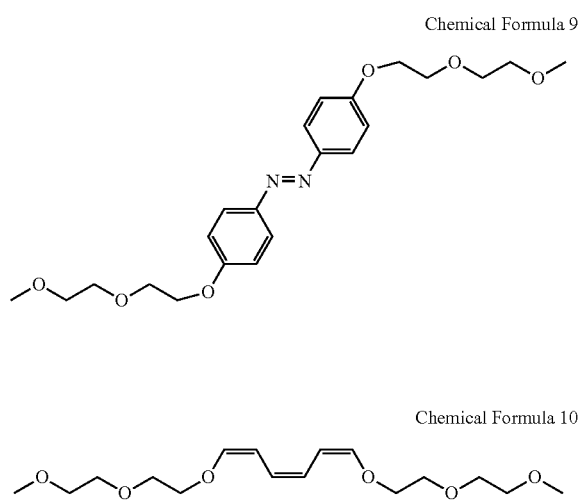

Chemical Formula 10

Chemical Formula 11

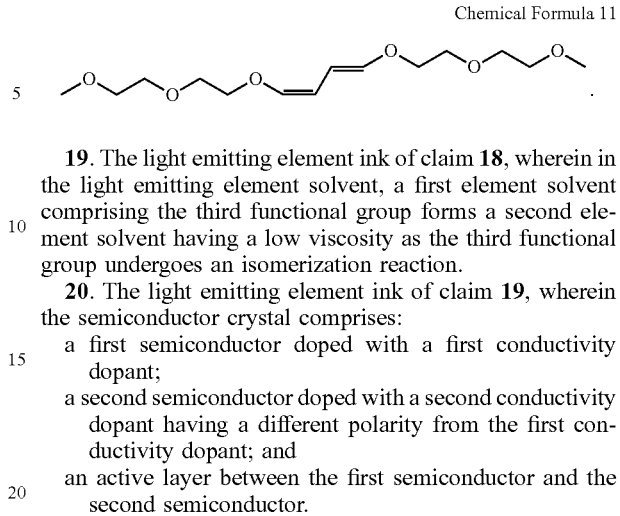

19. The light emitting element ink of claim 18, wherein in the light emitting element solvent, a first element solvent comprising the third functional group forms a second element solvent having a low viscosity as the third functional group undergoes an isomerization reaction.

20. The light emitting element ink of claim 19, wherein the semiconductor crystal comprises:
 a first semiconductor doped with a first conductivity dopant;
 a second semiconductor doped with a second conductivity dopant having a different polarity from the first conductivity dopant; and
 an active layer between the first semiconductor and the second semiconductor.

\* \* \* \* \*